(12) United States Patent
Kim et al.

(10) Patent No.: US 10,553,541 B2
(45) Date of Patent: *Feb. 4, 2020

(54) FAN-OUT SEMICONDUCTOR PACKAGE

(71) Applicant: SAMSUNG ELECTRO-MECHANICS CO., LTD., Suwon-Si, Gyeonggi-Do (KR)

(72) Inventors: Hyung Joon Kim, Suwon-Si (KR); Jung Ho Shim, Suwon-Si (KR); Dae Hyun Park, Suwon-Si (KR); Han Kim, Suwon-Si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/955,230

(22) Filed: Apr. 17, 2018

(65) Prior Publication Data

US 2018/0233454 A1 Aug. 16, 2018

Related U.S. Application Data

(63) Continuation of application No. 15/666,266, filed on Aug. 1, 2017, now Pat. No. 10,157,851.

(30) Foreign Application Priority Data

Dec. 16, 2016 (KR) .......................... 10-2016-0172809

(51) Int. Cl.
*H01L 23/538* (2006.01)
*H01L 25/065* (2006.01)
*H01L 23/00* (2006.01)

(52) U.S. Cl.
CPC .......... *H01L 23/5389* (2013.01); *H01L 24/08* (2013.01); *H01L 24/13* (2013.01);
(Continued)

(58) Field of Classification Search
CPC ...... H01L 23/5389; H01L 24/08; H01L 24/25; H01L 25/0652; H01L 23/5384;
(Continued)

(56) References Cited

U.S. PATENT DOCUMENTS 5,883,436 A * 3/1999 Sadjadi ............ H01L 21/76804
257/758
9,397,034 B2 7/2016 Eun
(Continued)

FOREIGN PATENT DOCUMENTS

KR 10-2008-0094203 A 10/2008
KR 10-2013-0077033 A 7/2013
(Continued)

OTHER PUBLICATIONS

Non-Final Office Action issued in related parent U.S. Appl. No. 15/666,266, dated Feb. 26, 2018.
(Continued)

*Primary Examiner* — Syed I Gheyas
(74) *Attorney, Agent, or Firm* — Morgan, Lewis & Bockius LLP

(57) ABSTRACT

The present disclosure relates to a fan-out semiconductor package in which a plurality of semiconductor chips are stacked and packaged, and are disposed in a special form to be thus electrically connected to a redistribution layer of a connection member through vias rather than wires. The fan-out semiconductor package can further include a connection member having a through-hole, and at least one of the semiconductor chips can be disposed in the through-hole.

19 Claims, 16 Drawing Sheets

(52) U.S. Cl.
CPC .............. *H01L 24/24* (2013.01); *H01L 24/25* (2013.01); *H01L 25/0652* (2013.01); *H01L 23/5384* (2013.01); *H01L 2224/08235* (2013.01); *H01L 2224/13024* (2013.01); *H01L 2224/24137* (2013.01); *H01L 2224/24146* (2013.01); *H01L 2224/25171* (2013.01)

(58) Field of Classification Search
CPC ..................... H01L 24/13; H01L 24/24; H01L 2224/13024; H01L 2224/08235; H01L 2224/25171; H01L 2224/24137; H01L 2224/24146
See application file for complete search history.

(56) References Cited

U.S. PATENT DOCUMENTS

| | | |
|---|---|---|
| 2008/0258288 A1 | 10/2008 | Park et al. |
| 2012/0161331 A1 | 6/2012 | Gonzalez et al. |
| 2013/0168798 A1 | 7/2013 | Chang et al. |
| 2014/0070396 A1 | 3/2014 | Kyozuka et al. |
| 2014/0360765 A1 | 12/2014 | Kiwanami et al. |
| 2015/0001708 A1 | 1/2015 | Lin |
| 2015/0001727 A1 | 1/2015 | Lee et al. |
| 2015/0200182 A1 | 7/2015 | Wang et al. |
| 2015/0364448 A1 | 12/2015 | Huang et al. |
| 2015/0373849 A1 | 12/2015 | Huang et al. |
| 2016/0086931 A1 | 3/2016 | Jang et al. |
| 2016/0093571 A1* | 3/2016 | Kim ................... H01L 21/486 257/774 |
| 2017/0345761 A1 | 11/2017 | Yu et al. |

FOREIGN PATENT DOCUMENTS

| | | |
|---|---|---|
| TW | 201246499 A | 11/2012 |
| TW | 201327770 A | 7/2013 |
| TW | 201501247 A | 1/2015 |
| TW | 201546985 A | 12/2015 |
| TW | 201601276 A | 1/2016 |

OTHER PUBLICATIONS

Office Action issued in corresponding Taiwanese Patent Application No. 106123761, dated Sep. 26, 2018.

Korean Office Action dated Oct. 22, 2018 issued in Korean Patent Application No. 10-2016-0172809 (with English translation).

* cited by examiner

FAN-OUT SEMICONDUCTOR PACKAGE

CROSS-REFERENCE TO RELATED APPLICATION(S)

This application is a Continuation of U.S. patent application Ser. No. 15/666,266, filed on Aug. 1, 2017, which claims benefit of priority to Korean Patent Application No. 10-2016-0172809 filed on Dec. 16, 2016 in the Korean Intellectual Property Office, the disclosure of which are incorporated herein by reference in their entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

Recently, a significant trend in the development of technology related to semiconductor chips has been to reduce the size of semiconductor chips. Therefore, in the field of package technology, in accordance with a rapid increase in demand for small-sized semiconductor chips, and the like, the implementation of a semiconductor package having a compact size, while including a plurality of pins, has been demanded.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package capable of being thinned and having improved performance and excellent reliability in spite of using a plurality of semiconductor chips.

According to an aspect of the present disclosure, a fan-out semiconductor package may be provided, in which a plurality of semiconductor chips are stacked and packaged, and are disposed in a special form to be thus electrically connected to a redistribution layer of a connection member through vias rather than wires.

According to an aspect of the present disclosure, a fan-out semiconductor package may include: a first connection member including a redistribution layer; a first semiconductor chip disposed on the first connection member and having an active surface having first connection pads disposed thereon and an inactive surface opposing the active surface; a first encapsulant disposed on the first connection member and encapsulating at least portions of the first semiconductor chip; a second semiconductor chip disposed on the first encapsulant and having an active surface having second connection pads disposed thereon and an inactive surface opposing the active surface; and a second encapsulant disposed on the first encapsulant and encapsulating at least portions of the second semiconductor chip. The active surfaces of the first semiconductor chip and the second semiconductor chip face the first connection member, and the first connection pads and the second connection pads are electrically connected to the redistribution layer of the first connection member through a first via and a second via that do not overlap each other, respectively.

According to another aspect of the present disclosure, a fan-out semiconductor package may include: a first connection member having a through-hole; a first semiconductor chip disposed in the through-hole and having an active surface having first connection pads disposed thereon and an inactive surface opposing the active surface; a second semiconductor chip disposed on the inactive surface of the first semiconductor chip and having an active surface having second connection pads disposed thereon and an inactive surface opposing the active surface; an encapsulant encapsulating at least portions of the first connection member, the first semiconductor chip, and the second semiconductor chip; and a second connection member disposed on the first connection member, the active surface of the first semiconductor chip, and the active surface of the second semiconductor chip, and including a redistribution layer electrically connected to the first connection pads and the second connection pads, wherein the first connection pads are disposed on a central portion of the active surface of the first semiconductor chip, the second connection pads are disposed on a central portion of the active surface of the second semiconductor chip, and the first connection pads and the second connection pads are electrically connected to the redistribution layer of the second connection member through first vias and second vias that do not overlap each other, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
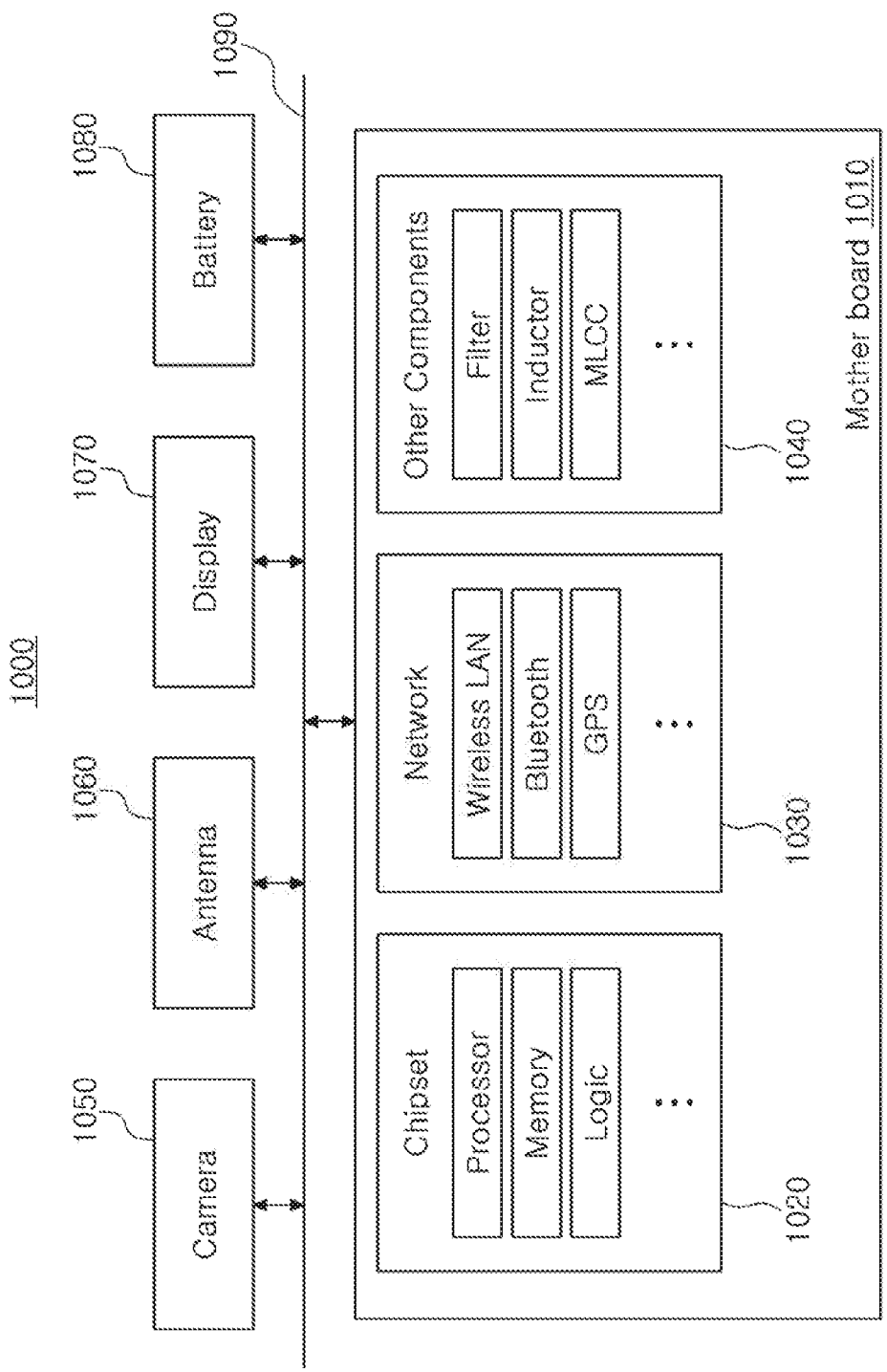
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" encompasses the concepts of a physical connection and a physical disconnection. It can be understood that when an element is referred to using terms such as "first" and "second", the element is not limited thereby. They may only be used for a purpose of distinguishing one element from other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
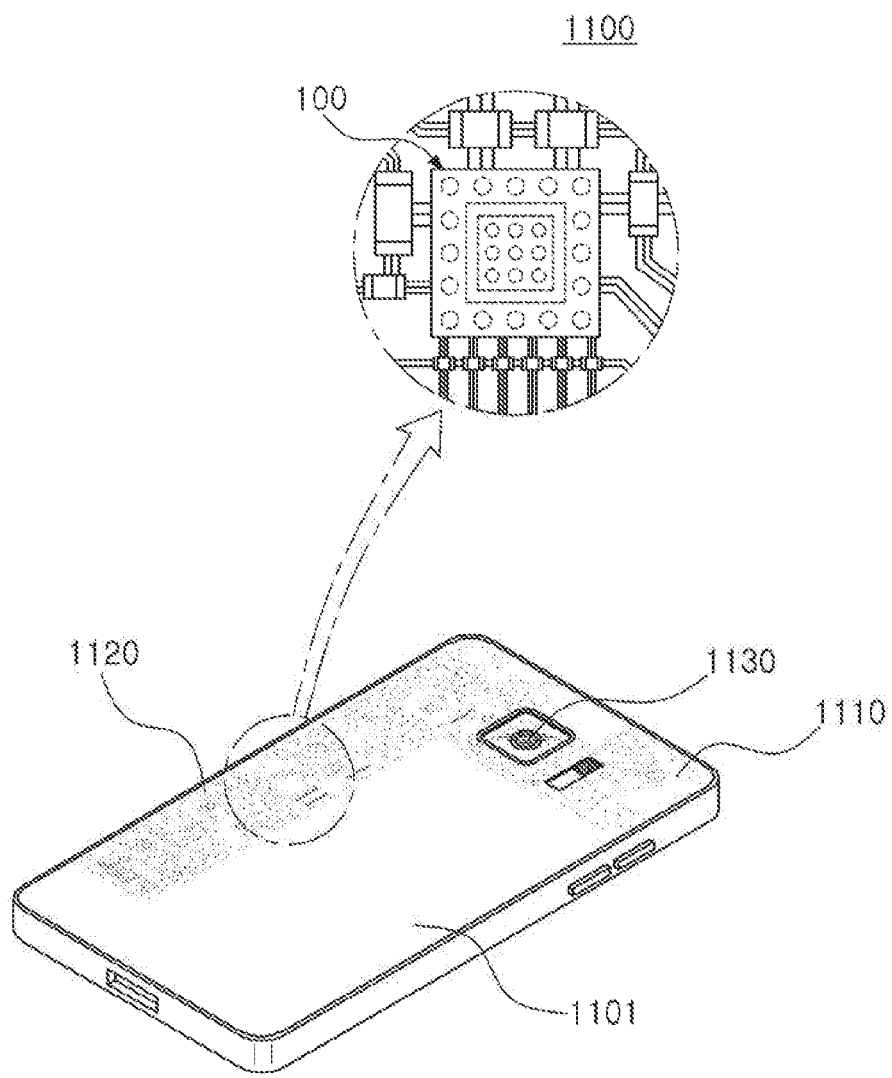
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3:
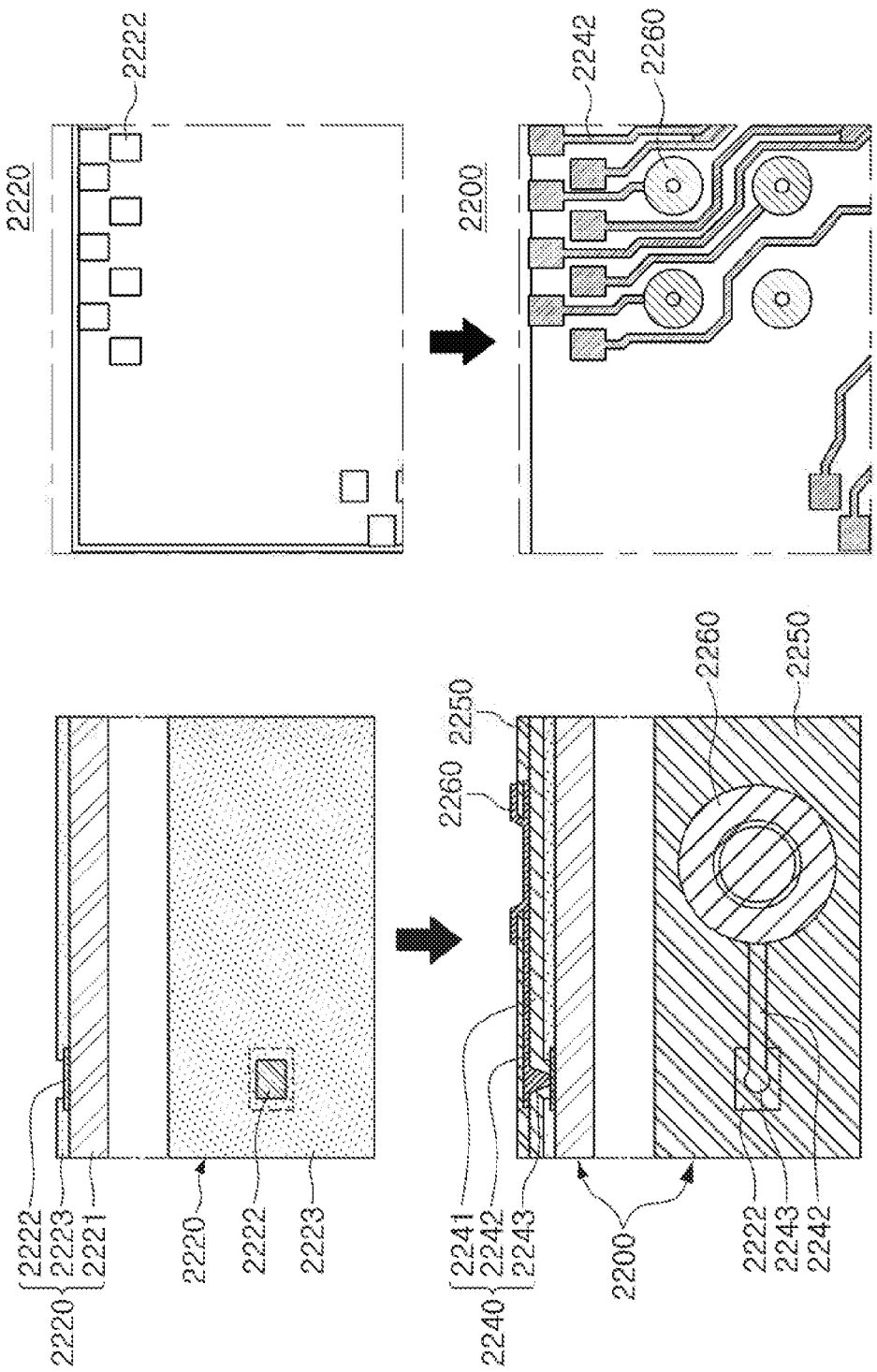
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
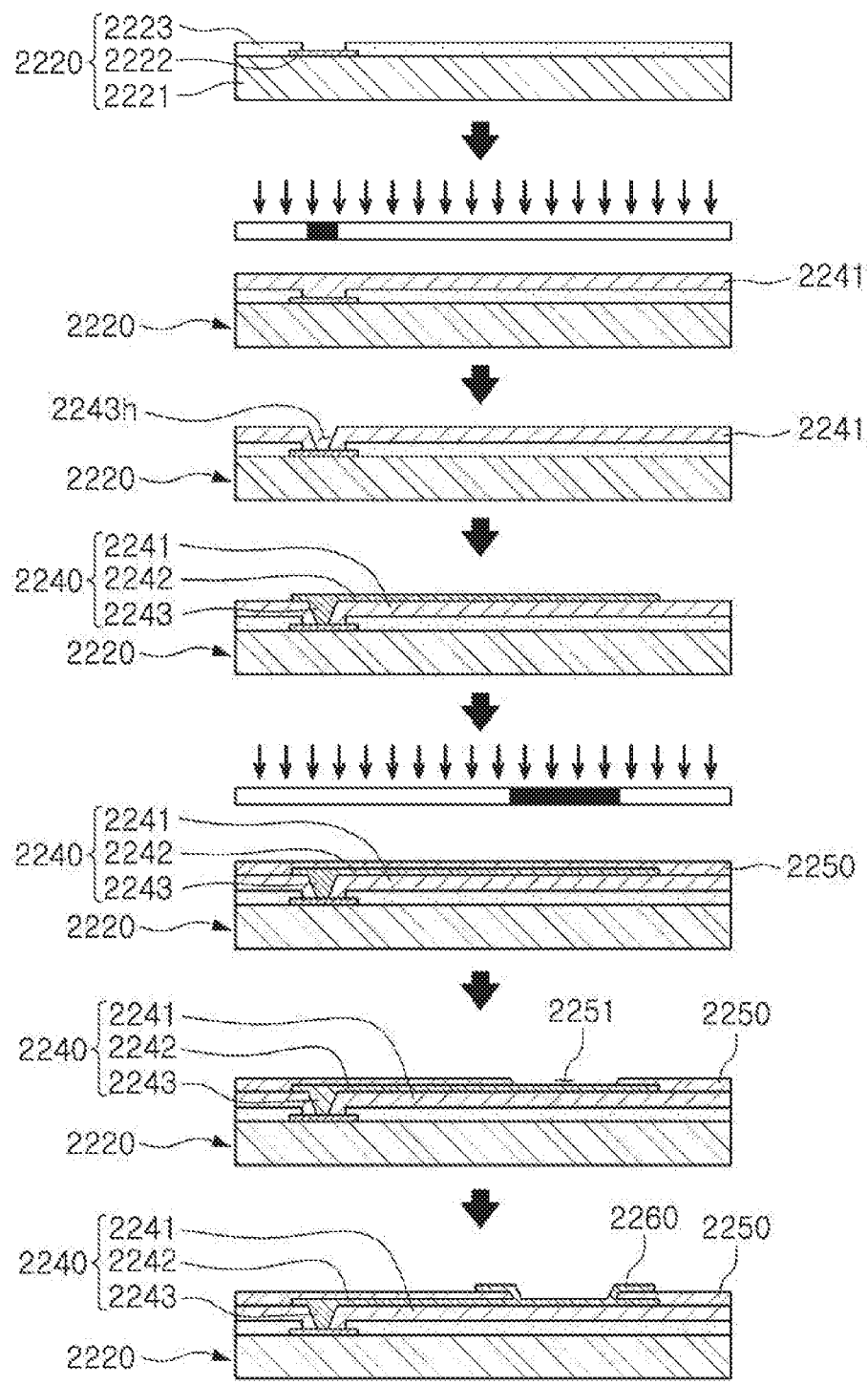
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a significant spatial limitation. Therefore, it may be difficult to apply this structure to a semiconductor chip having a large number of I/O terminals or a semiconductor chip having a compact size. In addition, due to the disadvantages described above, the fan-in semiconductor package may not be directly mounted and used on the main board of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
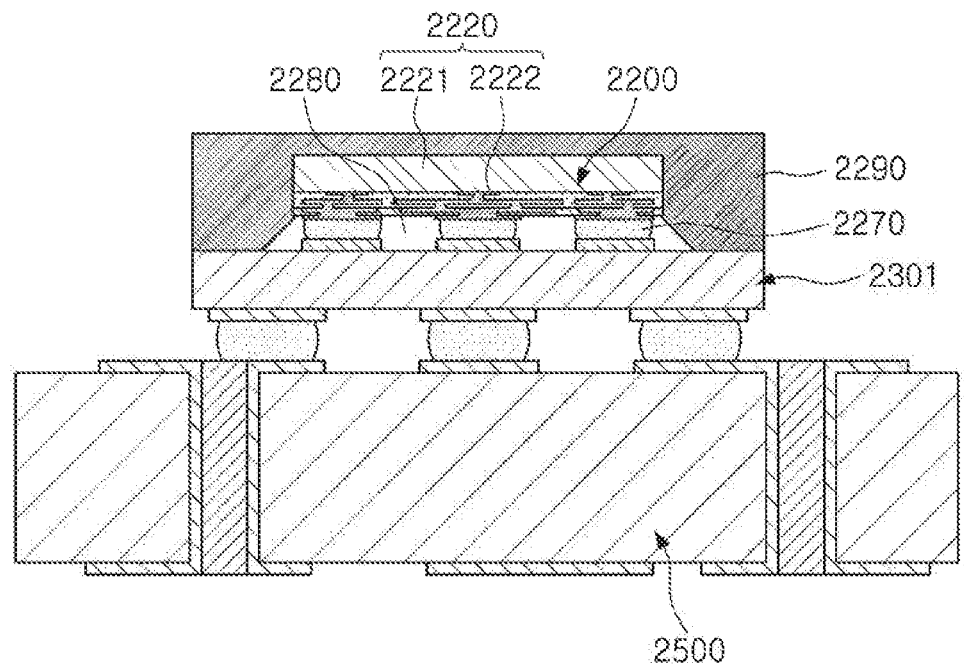
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
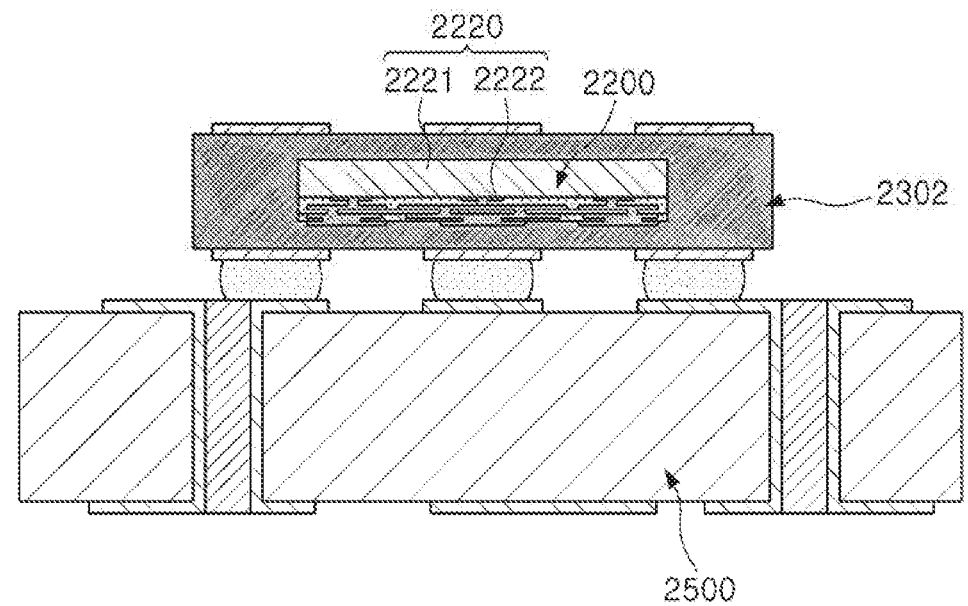
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
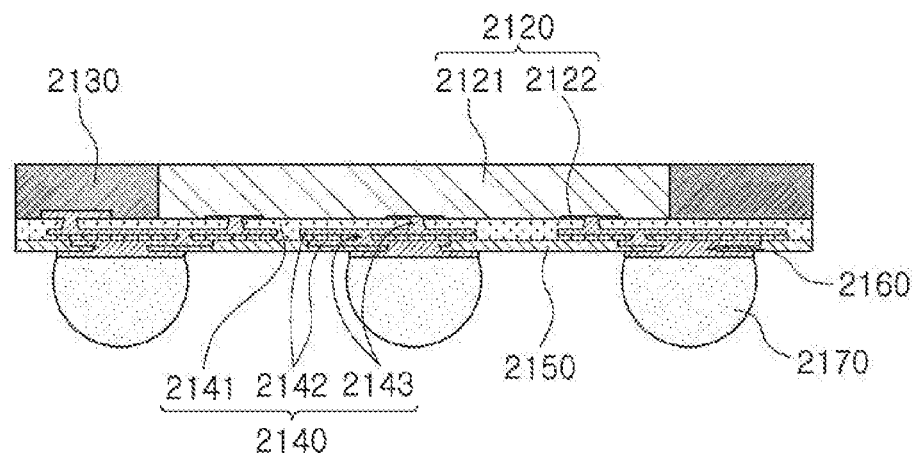
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
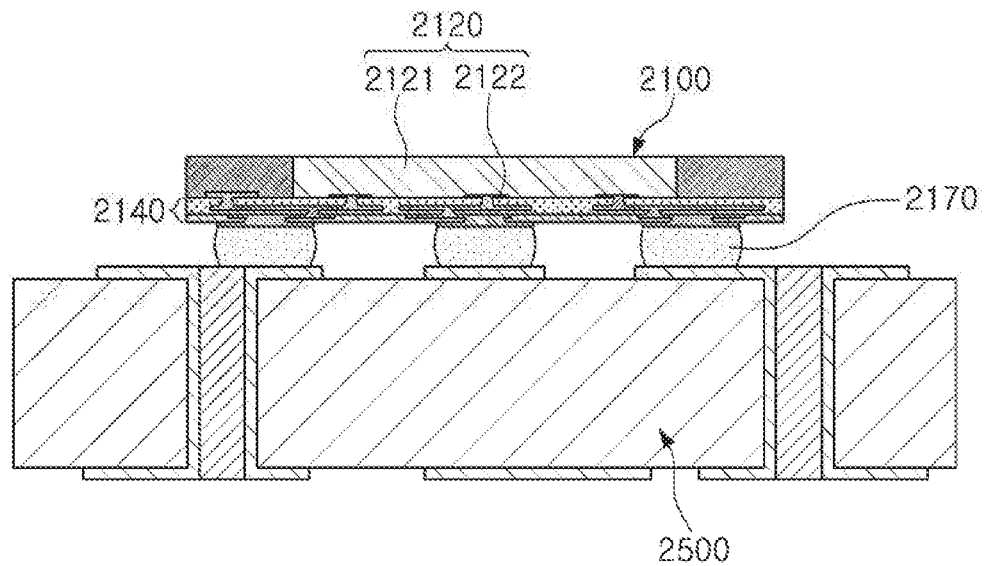
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region having a greater area than that region having a greater area than that of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile device. Therefore, the fan-out semiconductor package may be implemented in a form more compact than that of a general package-on-package (POP) type using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package capable of being thinned and having improved performance and excellent reliability in spite of using a plurality of semiconductor chips will hereinafter be described with reference to the drawings.

Figure 9:
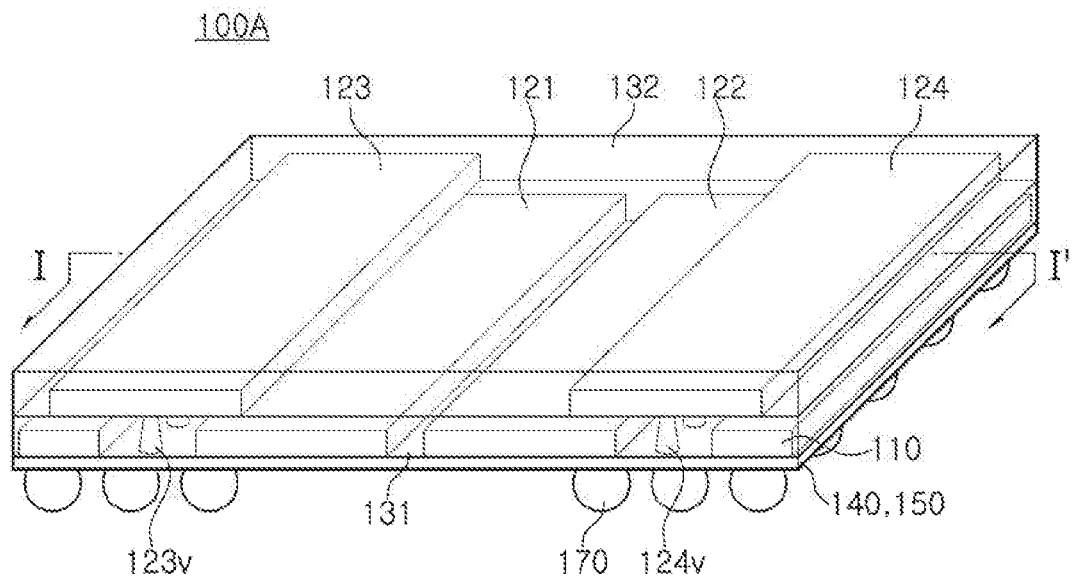
FIG. 9 is a schematic perspective view illustrating an example of a fan-out semiconductor package.

FIG. 9 is a schematic perspective view illustrating an example of a fan-out semiconductor package.

Figure 10:
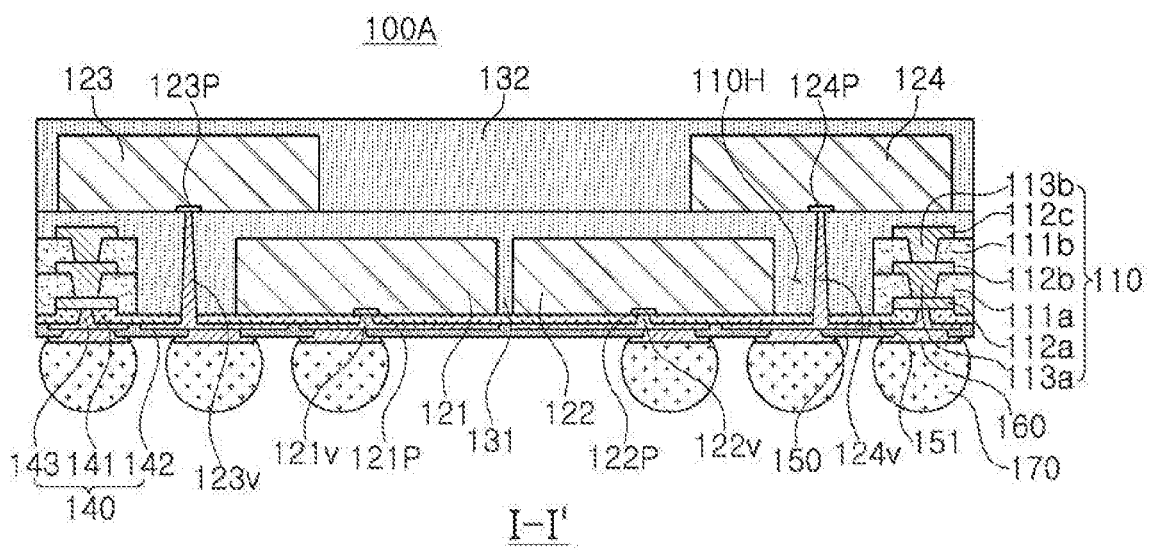
FIG. 10 is a schematic cross-sectional view taken along line I-I' of the fan-out semiconductor package of FIG. 9.

FIG. 10 is a schematic cross-sectional view taken along line I-I' of the fan-out semiconductor package of FIG. 9.

Referring to the drawings, a fan-out semiconductor package 100A according to an exemplary embodiment in the present disclosure may include a first connection member 110 having a through-hole 110H, a first semiconductor chip 121 disposed in the through-hole 110H and having an active surface having first connection pads 121P disposed thereon and an inactive surface opposing the active surface, a second semiconductor chip 122 disposed side by side with the first semiconductor chip 121 in the through-hole 110H and having an active surface having second connection pads 122P disposed thereon and an inactive surface opposing the active surface, a third semiconductor chip 123 disposed on the inactive surface of the first semiconductor chip 121 and having an active surface having third connection pads 123P disposed thereon and an inactive surface opposing the active surface, a fourth semiconductor chip 124 disposed side by side with the third semiconductor chip 123 on the inactive surface of the second semiconductor chip 122 and having an active surface having fourth connection pads 124P disposed thereon and an inactive surface opposing the active surface, a first encapsulant 131 encapsulating at least portions of the first connection member 110 and the inactive surfaces of the first semiconductor chip 121 and the second semiconductor chip 122, a second encapsulant 132 disposed on the first encapsulant 131 and encapsulating at least portions of the third semiconductor chip 123 and the fourth semiconductor chip 124, and a second connection member 140 disposed on the first connection member 110 and the active surfaces of the first to fourth semiconductor chips 121, 122, 123, and 124. The first connection member 110 may include redistribution layers 112a, 112b, and 112c electrically connected to the first to fourth connection pads 121P, 122P, 123P, and 124P. The second connection member 140 may include a redistribution layer 142 electrically connected to the first to fourth connection pads 121P, 122P, 123P, and 124P. In this case, the first to fourth connection pads 121P, 122P, 123P, and 124P may be disposed on central portions of the active surfaces of the first to fourth semiconductor chips 121, 122, 123, and 124, respectively. The third semiconductor chip 123 may be disposed on the inactive surface of the first semiconductor chip 121 to be mismatched to the first semiconductor chip 121 so that the third connection pads 123P are exposed. The fourth semiconductor chip 124 may be disposed on the inactive surface of the second semiconductor chip 122 to be mismatched to the second semiconductor chip 122 so that the fourth connection pads 124P are exposed. The redistribution layer 142 of the second connection member 140 may be connected to the first to fourth connection pads 121P, 122P, 123P, and 124P through first to fourth vias 121v, 122v, 123v, and 124v that do not overlap each other, respectively. The first to fourth vias 121v, 122v, 123v, and 124v may be perpendicular to the second connection member 140. Here, a term 'perpendicular' is a concept including a case in which an angle is approximately 90° as well as a case in which an angle is complete 90°. The third and fourth vias 123v and 124v may have a height greater than that of the first and second vias 121v and 122v in a direction perpendicular to the second connection member 140.

Figure 21:
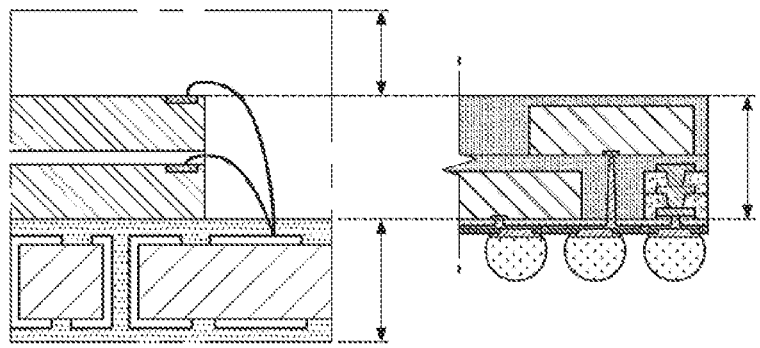
FIG. 21 is a schematic view illustrating an effect of a fan-out semiconductor package according to an exemplary embodiment in the present disclosure.
Figure 22:
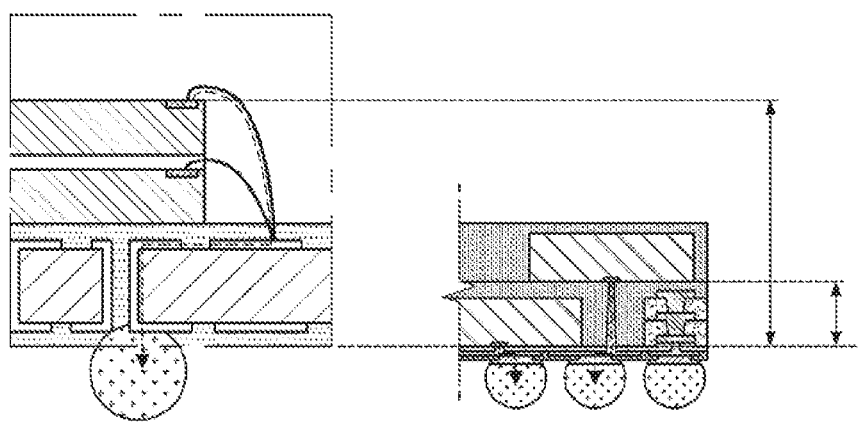
FIG. 22 is a schematic view illustrating another effect of a fan-out semiconductor package according to an exemplary embodiment in the present disclosure.

Meanwhile, recently, technology of stacking a plurality of memory chips in multiple stages in order to increase a capacity of a memory has been developed. For example, as illustrated in left drawings of FIGS. 21 and 22, there may be technology of stacking a plurality of memory chips in two stages (or three stages), mounting the stacked memory chips on an interposer substrate, and then molding the stacked memory chips mounted on the interposer substrate using a molding material to form a package. In this case, the stacked memory chips are electrically connected to the interposer substrate by wire bonding. However, in this structure, there is a limitation in thinness due to a significant thickness of the interposer substrate. In addition, when the interposer substrate is manufactured on the basis of silicon, a significant cost is required. In addition, when a reinforcing material holding the stacked memory chips is not separately included, a problem may occur in reliability due to warpage. In addition, since the stacked memory chips are electrically connected to the interposer substrate by the wire bonding, such that inputs and outputs are redistributed, signal paths are significantly long, such that signal loss may be frequently generated.

Figure 20A:
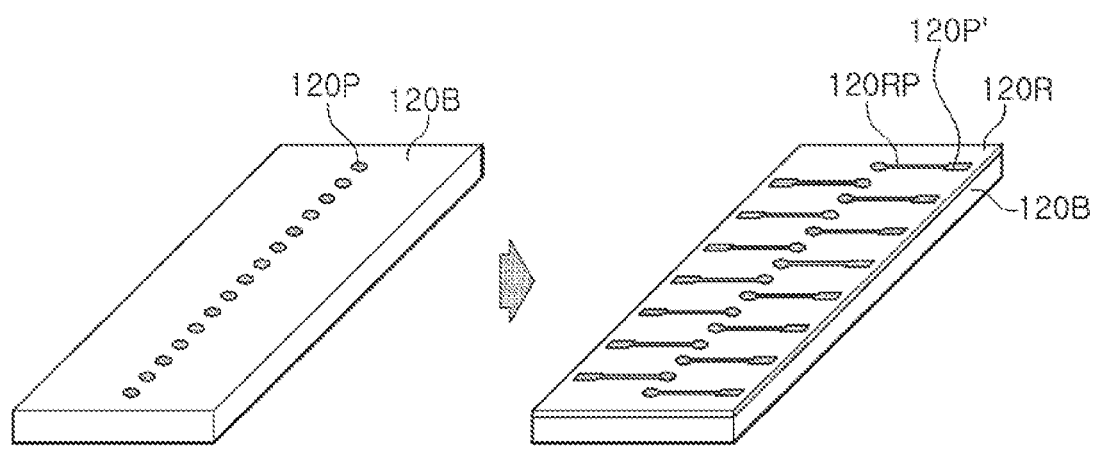
FIGS. 20A and 20B are schematic views illustrating a process of redistributing a semiconductor chip in a bare state.
Figure 20B:
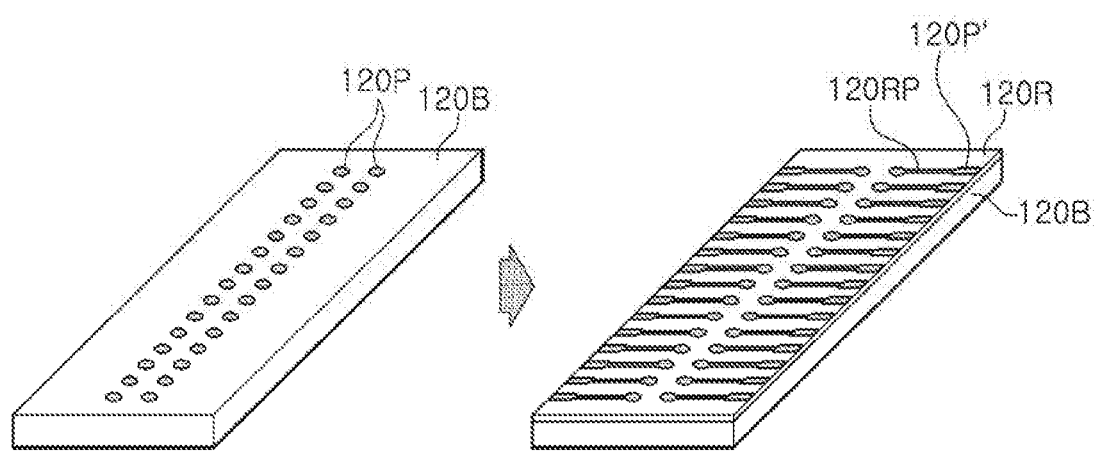

Particularly, in such a wire bonding manner, connection pads disposed on a central portion of an active surface of a semiconductor chip need to be intentionally redistributed outwardly of the active surface of the semiconductor chip by forming a redistribution layer in order to stack the semiconductor chip. For example, as illustrated in FIG. 20A, connection pads 120P disposed in a row on a central portion of an active surface of a semiconductor chip 120B in a bare state may be redistributed outwardly of the active surface of the semiconductor chip 120B by redistribution patterns 120RP of a redistribution layer 120R. Alternatively, as illustrated in FIG. 20B, connection pads 120P disposed in two rows on a central portion of an active surface of a semiconductor chip 120B in a bare state may be redistributed outwardly of the active surface of the semiconductor chip 120B by redistribution patterns 120RP of a redistribution layer 120R. In any case, redistributed connection pads 120P' may be positioned on both sides of the active surface of the semiconductor chip 120B. In this case, there is a limitation in an efficient design and disposition of the semiconductor chip 120B. For example, signal loss may be generated due to an increase in signal paths, or the like. In addition, a separate redistribution layer forming process needs to be added, and productivity may thus be reduced.

On the other hand, in the fan-out semiconductor package 100A according to the exemplary embodiment, the third and fourth semiconductor chips 123 and 124 disposed at an upper portion of the fan-out semiconductor package 100A as well as the first and second semiconductor chips 121 and 122 disposed at a lower portion of the fan-out semiconductor package 100A may be packaged in a bare state. That is, the first and second connection pads 121P and 122P of the first and second semiconductor chips 121 and 122 may be disposed on the central portions of the active surfaces of the first and second semiconductor chips 121 and 122, respectively, and the third and fourth connection pads 123P and 124P of the third and fourth semiconductor chips 123 and 124 may be disposed on the central portions of the active surfaces of the third and fourth semiconductor chips 123 and 124, respectively. The reason is that the third and fourth semiconductor chips 123 and 124 are disposed on the first and second semiconductor chips 121 and 122, respectively, to be mismatched to the first and second semiconductor chips 121 and 122, respectively, by introducing a plurality of encapsulants 131 and 132 so that the third and fourth connection pads 123P and 124P are not blocked by the first and second semiconductor chips 121 and 122, respectively. In this case, the third and fourth semiconductor chips 123 and 124 as well as the first and second semiconductor chips 121 and 122 may be connected to the redistribution layer 142 of the second connection member 140 through the vias 123v and 124v having a conductor form rather than wire bonding. As described above, redistribution layers for redesigning the connection pads 121P, 122P, 123P, and 124P of the semiconductor chips 121, 122, 123, and 124 are not required, and the connection pads 121P, 122P, 123P, and 124P disposed on the central portions of the semiconductor chips 121, 122, 123, and 124 for the purpose of the most efficient design of the semiconductor chips 121, 122, 123, and 124 may thus be used in the fan-out semiconductor package 100A without being separately changed.

In addition, in the fan-out semiconductor package 100A according to the exemplary embodiment, the first connection member 110 having the redistribution layers 112a, 112b, and 112c may be introduced, and a plurality of stacked semiconductor chips 121, 122, 123, and 124 may be disposed in the through-hole 110H of the first connection member 110. In addition, the second connection member 140 including the redistribution layer 142 may be formed instead of introduction of the interposer substrate. Particularly, the plurality of stacked semiconductor chips 121, 122, 123, and 124 may be connected to the redistribution layer 142 of the second connection member 140 through multi-stage vias 121v, 122v, 123v, and 124v having different heights rather than the wire bonding. Therefore, as illustrated in a right drawing of FIG. 21, the redistribution may be distributed to various positions, such that a thickness of the second connection member 140 may be significantly reduced, and a backside encapsulation thickness or a thickness of the stacked chips may also be significantly reduced. In addition, illustrated in a right drawing of FIG. 22, signal paths from the stacked semiconductor chips 121, 122, 123, and 124 to connection terminals 170 may be significantly reduced, and signal loss is thus reduced, resulting in improvement of signal electrical characteristics. In addition, warpage may be controlled through the first connection member 110, and reliability may thus be improved.

In addition, in the fan-out semiconductor package 100A according to the exemplary embodiment, the third and fourth semiconductor chips 123 and 124 are not attached to the first and second semiconductor chips 121 and 122, respectively, but may be disposed on the first encapsulant 131 to be mismatched to the first and second semiconductor chips 121 and 122, respectively, and be then encapsulated with the second encapsulant 132. Therefore, a separate tape, or the like, for fixing the semiconductor chips 123 and 124 disposed at the upper portion of the fan-out semiconductor package 100A is not required. The tape, or the like, may be omitted, such that a thickness of the fan-out semiconductor package 100A may be reduced and a cost of the fan-out semiconductor package 100A may be reduced, and the semiconductor chips 123 and 124 disposed at the upper portion of the fan-out semiconductor package 100A may be encapsulated by the separate encapsulant 132 to be thus more effectively fixed, such that reliability of the fan-out semiconductor package 100A may be improved. In addition, a problem that may occur in an encapsulating process in a case in which the third and fourth semiconductor chips 123 and 124 are directly attached to the first and second semiconductor chips 121 and 122, for example, a problem that the encapsulant is blocked by the third and fourth semiconductor chips 123 and 124, such that the encapsulant does not fill a space between the first and second semiconductor chips 121 and 122 may be prevented.

The respective components included in the fan-out semiconductor package 100A according to the exemplary embodiment will hereinafter be described in more detail.

The first connection member 110 may include the redistribution layers 112a, 112b, and 112c redistributing the connection pads 121P, 122P, 123P, and 124P of the semiconductor chips 121, 122, 123, and 124 to thus reduce the number of layers of the second connection member 140. If necessary, the first connection member 110 may maintain rigidity of the fan-out semiconductor package 100A depending on certain materials, and serve to secure uniformity of a thickness of the first encapsulant 131. In addition, due to the first connection member 110, the fan-out semiconductor package 100A according to the exemplary embodiment may be used as a portion of a package-on-package. The first connection member 110 may have the through-hole 110H. The first and second semiconductor chips 121 and 122 may be disposed side by side in the through-hole 110H to be spaced apart from the first connection member 110 by a predetermined distance. Meanwhile, a case in which the first connection member 110 is disposed at only left and right portions of the first and second semiconductor chips 121 and 122 opposing each other is illustrated in the drawings, but the first connection member 110 is not limited thereto. That is, the first connection member 110 disposed at front and rear portions of the first and second semiconductor chips 121 and 122 may be omitted in order to more clearly illustrate an inner portion of the fan-out semiconductor package 100A. That is, side surfaces of the first and second semiconductor chips 121 and 122 may be surrounded by the first connection member 110. However, such a form is only an example and may be variously modified to have other forms, and the first connection member 110 may perform another function depending on such a form.

The first connection member 110 may include a first insulating layer 111a in contact with the second connection member 140, a first redistribution layer 112a in contact with the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 121P, 122P, 123P, and 124P. The first and second redistribution layers 112a and 112b and the second and third redistribution layers 112b and 112c may be electrically connected to each other through first and second vias 113a and 113b, respectively.

Since the first redistribution layer 112a is embedded in the first insulating layer 111a, an insulating distance of an insulating layer 141 of a second connection member 140 may be substantially constant. Since the first connection member 110 may include a large number of redistribution layers 112a, 112b, and 112c, the second connection member 140 may be simplified. Therefore, a decrease in a yield after disposition of the semiconductor chips 121, 122, 123, and 124 due to a defect occurring in a process of forming the second connection member 140 may be suppressed. The first redistribution layer 112a may be recessed in the first insulating layer 111a, such that a lower surface of the first insulating layer 111a and a lower surface of the first redistribution layer 112a may have a step therebetween. Resultantly, when the first encapsulant 131 is formed, a phenomenon in which a material of the first encapsulant 131 bleeds to pollute the first redistribution layer 112a may be prevented.

Thicknesses of the redistribution layers 112a, 112b, and 112c of the first connection member 110 may be greater than that of the redistribution layer 142 of the second connection member 140. Since the first connection member 110 may have a thickness equal to or greater than that of the first and second semiconductor chips 121 and 122, the redistribution layers 112a, 112b, and 112c may be formed at large sizes depending on a scale of the first connection member 110. On the other hand, the redistribution layer 142 of the second connection members 140 may be formed at a relatively small size for thinness.

A material of each of the insulating layers 111a and 111b is not particularly limited. For example, an insulating material may be used as the material of each of the insulating layers. In this case, the insulating material may be a thermosetting resin such as an epoxy resin, a thermoplastic resin such as a polyimide resin, an insulating material in which the thermosetting resin or the thermoplastic resin is impregnated in an inorganic filler or a core material such as a glass fiber (or a glass cloth or a glass fabric), for example, prepreg, Ajinomoto Build up Film (ABF), FR-4, Bismaleimide Triazine (BT), or the like. Alternatively, a photoimagable dielectric (PID) resin may also be used as the material of each of the insulating layers 111a and 111b.

The redistribution layers 112a, 112b, and 112c may serve to redistribute the connection pads 121P, 122P, 123P, and 124P of the semiconductor chips 121, 122, 123, and 124, and a material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may perform various functions depending on designs of their corresponding layers. For example, the redistribution layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, and 112c may include various pad patterns, and the like.

The vias 113a and 113b may electrically connect the redistribution layers 112a, 112b, and 112c formed on different layers to each other, resulting in an electrical path in the first connection member 110. A material of each of the vias 113a and 113b may be a conductive material. Each of the vias 113a and 113b may be completely filled with the conductive material, or the conductive material may also be formed along a wall of each of via holes. In addition, each of the vias 113a and 113b may have all of the shapes known in the related art, such as a tapered shape, a cylindrical shape, and the like. Meanwhile, it may be advantageous in a process that each of the vias 113a and 113b has the tapered shape of which a width of an upper surface is greater than that of a lower surface.

The semiconductor chips 121, 122, 123, and 124 may be an integrated circuit (IC) provided in an amount of several hundreds to several millions of elements or more integrated in a single chip. The IC may be a volatile memory (such as a DRAM), a non-volatile memory (such as a ROM), a flash memory, or the like, but is not limited thereto. The active surfaces of the semiconductor chips 121, 122, 123, and 124 refer to surfaces of the semiconductor chips 121, 122, 123, and 124 on which the connection pads 121P, 122P, 123P, and 124P are disposed, and the inactive surfaces thereof refer to surfaces opposing the active surfaces.

The semiconductor chips 121, 122, 123, and 124 may be formed on the basis of active wafers. In this case, a base material of each of bodies of the semiconductor chips 121, 122, 123, and 124 may be silicon (Si), germanium (Ge), gallium arsenide (GaAs), or the like. Various circuits may be formed on the bodies. The connection pads 121P, 122P, 123P, and 124P may electrically connect the semiconductor chips 121, 122, 123, and 124 to other components. A material of each of the connection pads 121P, 122P, 123P, and 124P may be a conductive material such as aluminum (Al), or the like. A passivation layer (not illustrated) exposing the connection pads 121P, 122P, 123P, and 124P may be formed on the bodies, and may be an oxide film, a nitride film, or the like, or a double layer of an oxide layer and a nitride layer. An insulating layer (not illustrated), and the like, may also be further disposed in required positions.

The semiconductor chips 121, 122, 123, and 124 may be connected to the redistribution layer 142 of the second connection member 140 through the vias 121v, 122v, 123v, and 124v, respectively. The first and second vias 121v and 122v do not penetrate through the first encapsulant 131, but the third and fourth vias 123v and 124v may penetrate through the first encapsulant 131. The first and second vias 121v and 122v may not be in contact with the first encapsulant 131, but the third and fourth vias 123v and 124v may be in contact with the first encapsulant 131. The third and fourth vias 123v and 124v may have heights greater than those of the first and second vias 121v and 122v. The heights of the first and second vias 121v and 122v may be substantially the same as each other. The heights of the third and fourth vias 123v and 124v may be substantially the same as each other. These vias 121v, 122v, 123v, and 124v may have a general via conductor form. That is, the connection pads 121P, 122P, 123P, and 124P of the semiconductor chips 121, 122, 123, and 124 may be connected to the redistribution layer 142 of the second connection member 140 through the vias 121v, 122v, 123v, and 124v having the via conductor form rather than wire bonding.

The first and second semiconductor chips 121 and 122 may be disposed side by side in the through-hole 110H, and at least portions of the first and second semiconductor chips 121 and 122 may be encapsulated by the first encapsulant 131. The third and fourth semiconductor chips 123 and 124 may be disposed on the first encapsulant 131, and at least portions of the third and fourth semiconductor chips 123 and 124 may be encapsulated by the second encapsulant 132. At least portions of the third and fourth semiconductor chips 123 and 124 may overlap the first connection member 110 in a stacking direction along which the third and fourth semiconductor chips 123 and 124 are staked on the first encapsulant 131. That is, the first to fourth semiconductor chips 121, 122, 123, and 124 may be fixed and packaged through the first encapsulant 131 and the second encapsulant 132 without using a separate tape.

The first encapsulant 131 may protect the first connection member 110 and the first and second semiconductor chips 121 and 122. An encapsulation form of the first encapsulant 131 is not particularly limited, but may be a form in which the first encapsulant 131 surrounds at least portions of the first connection member 110 and the first and second semiconductor chips 121 and 122. For example, the first encapsulant 131 may cover at least portions of the first connection member 110 and the inactive surfaces of the first and second semiconductor chips 121 and 122, and fill at least portions of spaces between walls of the through-hole 110H and the side surfaces of the first and second semiconductor chips 121 and 122. Meanwhile, the first encapsulant 131 may fill the through-hole 110H to thus serve as an adhesive for fixing the first and second semiconductor chips 121 and 122 and reduce buckling of the first and second semiconductor chips 121 and 122 depending on certain materials.

The first encapsulant 131 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an epoxy molding compound (EMC), or the like, may also be used. Alternatively, a material in which a thermosetting resin or a thermoplastic resin is impregnated in an inorganic filler and/or a core material such as a glass fiber (or a glass cloth or a glass fabric) may also be used as the insulating material.

The second encapsulant 132 may protect the third and fourth semiconductor chips 123 and 124. An encapsulation form of the second encapsulant 132 is not particularly limited, but may be a form in which the second encapsulant 132 surrounds at least portions of the third and fourth semiconductor chips 123 and 124. For example, the second encapsulant 132 may cover at least portions of the inactive surfaces of the third and fourth semiconductor chips 123 and 124, and may cover at least portions of side surfaces of the third and fourth semiconductor chips 123 and 124. The second encapsulant 132 may serve as an adhesive for fixing the third and fourth semiconductor chips 123 and 124 and reduce buckling of the third and fourth semiconductor chips 123 and 124 depending on certain materials.

The second encapsulant 132 may also include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an epoxy molding compound (EMC), or the like, may also be used. Alternatively, a material in which a thermosetting resin or a thermoplastic resin is impregnated in an inorganic filler and/or a core material such as a glass fiber (or a glass cloth or a glass fabric) may also be used as the insulating material.

The second connection member 140 may be configured to redistribute the connection pads 121P, 122P, 123P, and 124P of the semiconductor chips 121, 122, 123, and 124. Several tens to several hundreds of connection pads 121P, 122P, 123P, and 124P having various functions may be redistributed by the second connection member 140, and may be physically or electrically connected to an external source through connection terminals 170 to be described below depending on the functions. The second connection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second connection member 140 may include a single layer, and may also include a plurality of layers.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the connection pads 121P, 122P, 123P, and 124P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include various pad patterns such as via pads, connection terminal pads, and the like.

The vias 143 may electrically connect the redistribution layers formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

A passivation layer 150 may be additionally configured to protect the second connection member 140 from external physical or chemical damage. The passivation layer 150 may have openings 151 exposing at least portions of the redistribution layer 142 of the second connection member 140. The number of openings formed in the passivation layer 150 may be several tens to several thousands.

A material of the passivation layer 150 is not particularly limited, but may be a photosensitive insulating material such as a PID resin. Alternatively, a solder resist may also be used as the material of the passivation layer 150. Alternatively, an insulating resin that does not include a core material, but includes a filler, for example, ABF including an inorganic filler and an epoxy resin may be used as the material of the passivation layer 150. In a case in which an insulating material that includes an inorganic filler and an insulating resin, but does not include a core material, such as the ABF, or the like, is used as the material of the passivation layer 150, the passivation layer 150 and a resin layer 182 may have a symmetrical effect to each other, and may control warpage dispersion, which may be more effective in controlling warpage. When the insulating material including the inorganic filler and the insulating resin, such as the ABF, or the like, is used as the material of the passivation layer 150, the insulating layer 141 of the second connection member 140 may also include an inorganic filler and an insulating resin. In this case, a weight percent of the inorganic filler included in the passivation layer 150 may be greater than that of the inorganic filler included in the insulating layer 141 of the second connection member 140. In this case, the passivation layer 150 may have a relatively low a coefficient of thermal expansion (CTE), and may be utilized to control the warpage.

An underbump metal layer 160 may be additionally configured to improve connection reliability of the connection terminals 170 and improve board level reliability of the fan-out semiconductor package 100A. The underbump metal layer 160 may be connected to the redistribution layer 142 of the second connection member 140 opened through the openings 151 of the passivation layer 150. The underbump metal layer 160 may be formed in the openings 151 of the passivation layer 150 by the known metallization method using the known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands or may be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for a region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Meanwhile, although not illustrated in the drawings, a metal layer may be further disposed on the wall of the through-hole 110H, if necessary. The metal layer may serve to effectively dissipate heat generated from the semiconductor chips 121 and 122. In addition, the metal layer may also serve to block electromagnetic waves. In addition, a separate passive component such as a capacitor, an inductor, or the like, in addition to the semiconductor chips 121 and 122, may be further disposed in the through-hole 110H. In addition to the structures described above, the structures known in the related art may be applied.

FIGS. 11A through 11D are schematic views illustrating an example of processes of manufacturing the fan-out semiconductor package of FIG. 10.

Figure 11A:
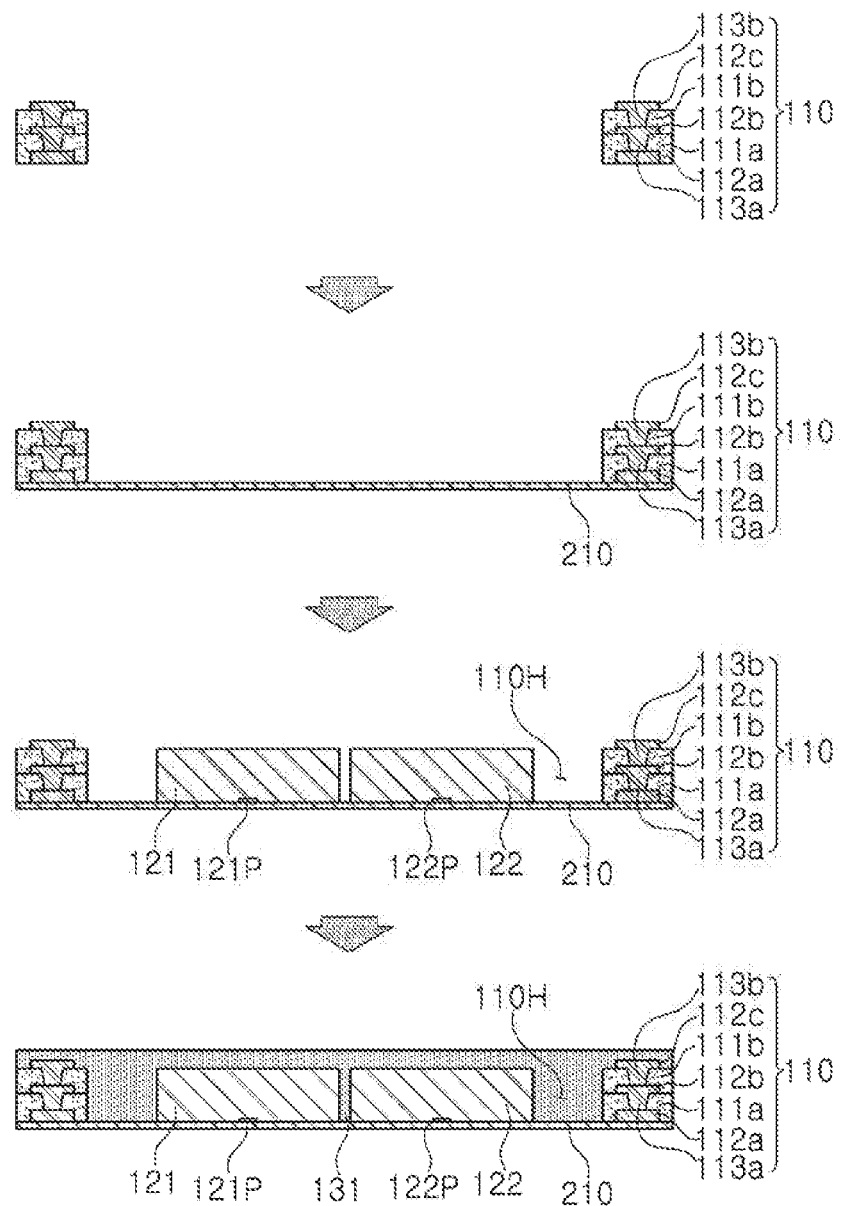
FIGS. 11A through 11D are schematic views illustrating an example of processes of manufacturing the fan-out semiconductor package of FIG. 10.

Referring to FIG. 11A, the first connection member 110 having the through-hole 110H may be prepared. The first connection member 110 may be prepared by, for example, preparing a carrier film having a metal layer formed on one surface or opposite surfaces thereof, forming the first redistribution layer 112a using the metal layer as a seed layer, forming the first insulating layer 111a covering the first redistribution layer 112a on the metal layer, forming the second redistribution layer 112b on the first insulating layer 111a, forming the second insulating layer 111b covering the second redistribution layer 112b on the first insulating layer 111a, forming the third redistribution layer 112c on the second insulating layer 111b to form the first connection member 110, separating the first connection member 110 from the carrier film, and then removing the metal layer remaining on the first redistribution layer 112a. When the metal layer is removed, a recess part may be formed in the first connection member 110. The redistribution layers 112a, 112b, and 112c may be formed by performing patterning using a dry film, or the like, and filling patterns by the known plating process. The insulating layers 111a and 111b may be formed by the known lamination method or applying and hardening method. Then, an adhesive film 210 may be attached to one surface of the first connection member 110. Any material that may fix the first connection member 110 may be used as the adhesive film 210. As a non-restrictive example, the known tape, or the like, may be used. An example of the known tape may include a thermosetting adhesive tape of which adhesion is weakened by heat treatment, an ultraviolet-curable adhesive tape of which adhesion is weakened by ultraviolet ray irradiation, or the like. Then, the first and second semiconductor chips 121 and 122 may be disposed in the through-hole 110H of the first connection member 110. For example, the first and second semiconductor chips 121 and 122 may be disposed in a face-down form on the adhesive film 210 in the through-hole 110H so that the active surfaces of the first and second semiconductor chips 121 and 122 on which the first and second connection pads 121P and 122P are disposed are attached to the adhesive film 210. Then, at least portions of the first connection member 110 and the first and second semiconductor chips 121 and 122 may be encapsulated using the first encapsulant 131. The first encapsulant 131 may encapsulate at least portions of the first connection member 110 and the inactive surfaces of the first and second semiconductor chips 121 and 122, and may fill at least portions of a space in the through-hole 110H. The first encapsulant 131 may be formed by the known method. For example, the first encapsulant 131 may be formed by a method of laminating a precursor of the first encapsulant 131 and then hardening the precursor. Alternatively, the first encapsulant 131 may be formed by applying a pre-encapsulant of the first encapsulant 131 to the adhesive film 210 to encapsulate at least portions of the first and second semiconductor chips 121 and 122, or the like, and then hardening the pre-encapsulant.

Figure 11B:
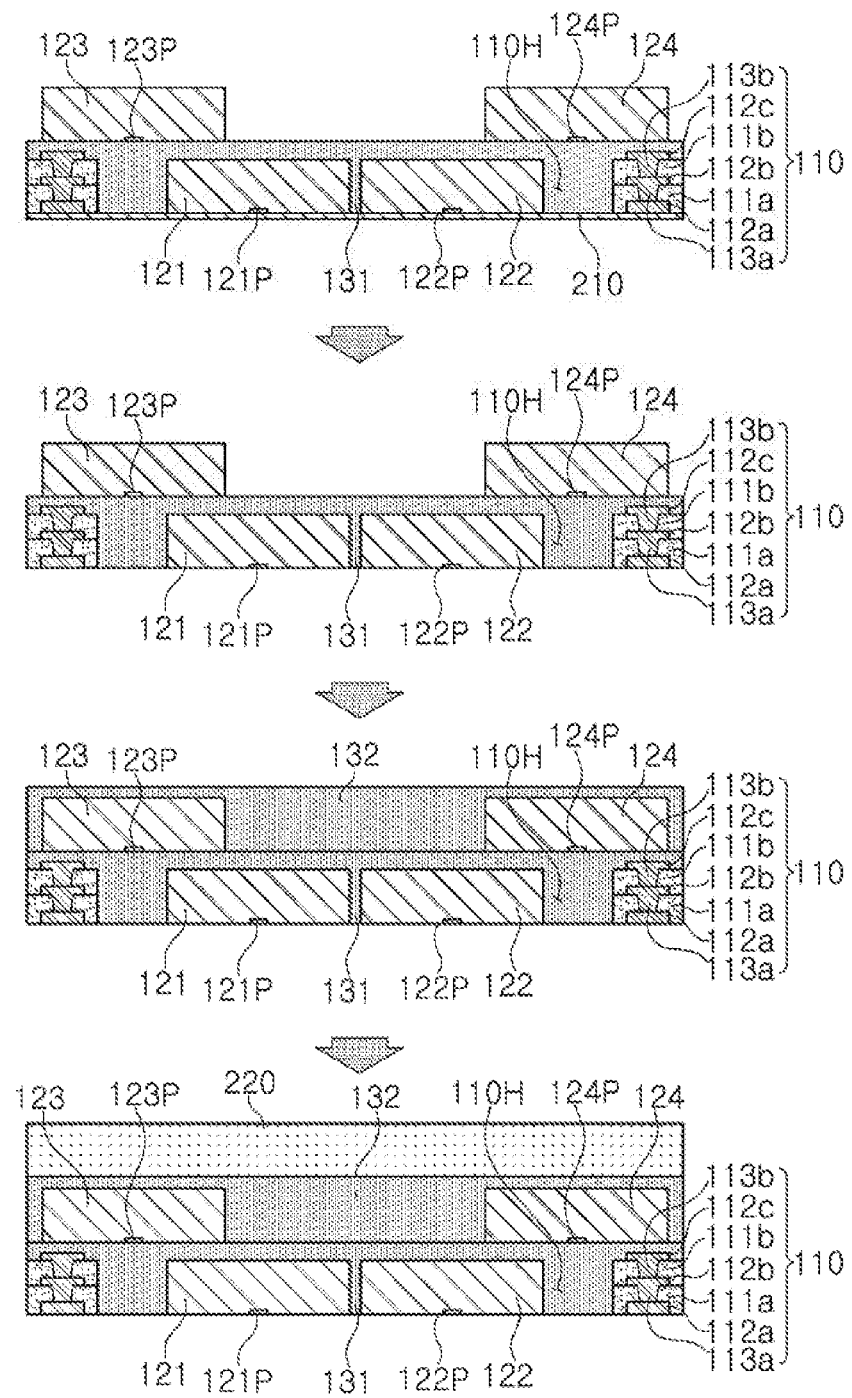

Then, referring to FIG. 11B, the third and fourth semiconductor chips 123 and 124 may be disposed on the first encapsulant 131. For example, the third and fourth semiconductor chips 123 and 124 may be disposed in a face-down form on the first encapsulant 131 to be mismatched to the first and second semiconductor chips 121 and 122, respectively, so that the active surfaces thereof on which the third and fourth connection pads 123P and 124P are disposed are attached to the first encapsulant 131. Then, the adhesive film 210 may be peeled off. A method of peeling off the adhesive film is not particularly limited, but may be the known method. For example, when the thermosetting adhesive tape of which adhesion is weakened by heat treatment, the ultraviolet-curable adhesive tape of which adhesion is weakened by ultraviolet ray irradiation, or the like, is used as the adhesive film 210, the adhesive film 210 may be peeled off after the adhesion of the adhesive film 210 is weakened by heat-treating the adhesive film 210 or may be peeled off after the adhesion of the adhesive film 210 is weakened by irradiating an ultraviolet ray to the adhesive film 210. Then, at least portions of the third and fourth semiconductor chips 123 and 124 may be encapsulated using the second encapsulant 132. The second encapsulant 132 may cover at least portions of the inactive surfaces of the third and fourth semiconductor chips 123 and 124, and may cover at least portions of the side surfaces of the third and fourth semiconductor chips 123 and 124. The second encapsulant 132 may be formed by the known method. For example, the second encapsulant 132 may be formed by a method of laminating a precursor of the first encapsulant 130 and then hardening the precursor. Alternatively, the second encapsulant 132 may be formed by applying a pre-encapsulant of the second encapsulant 132 to the first encapsulant 131 to encapsulate at least portions of the third and fourth semiconductor chips 123 and 124, or the like, and then hardening the pre-encapsulant. Then, a detachable film 220 may be attached to the second encapsulant 132, if necessary. A material, or the like, of the detachable film 220 is not particularly limited.

Figure 11C:
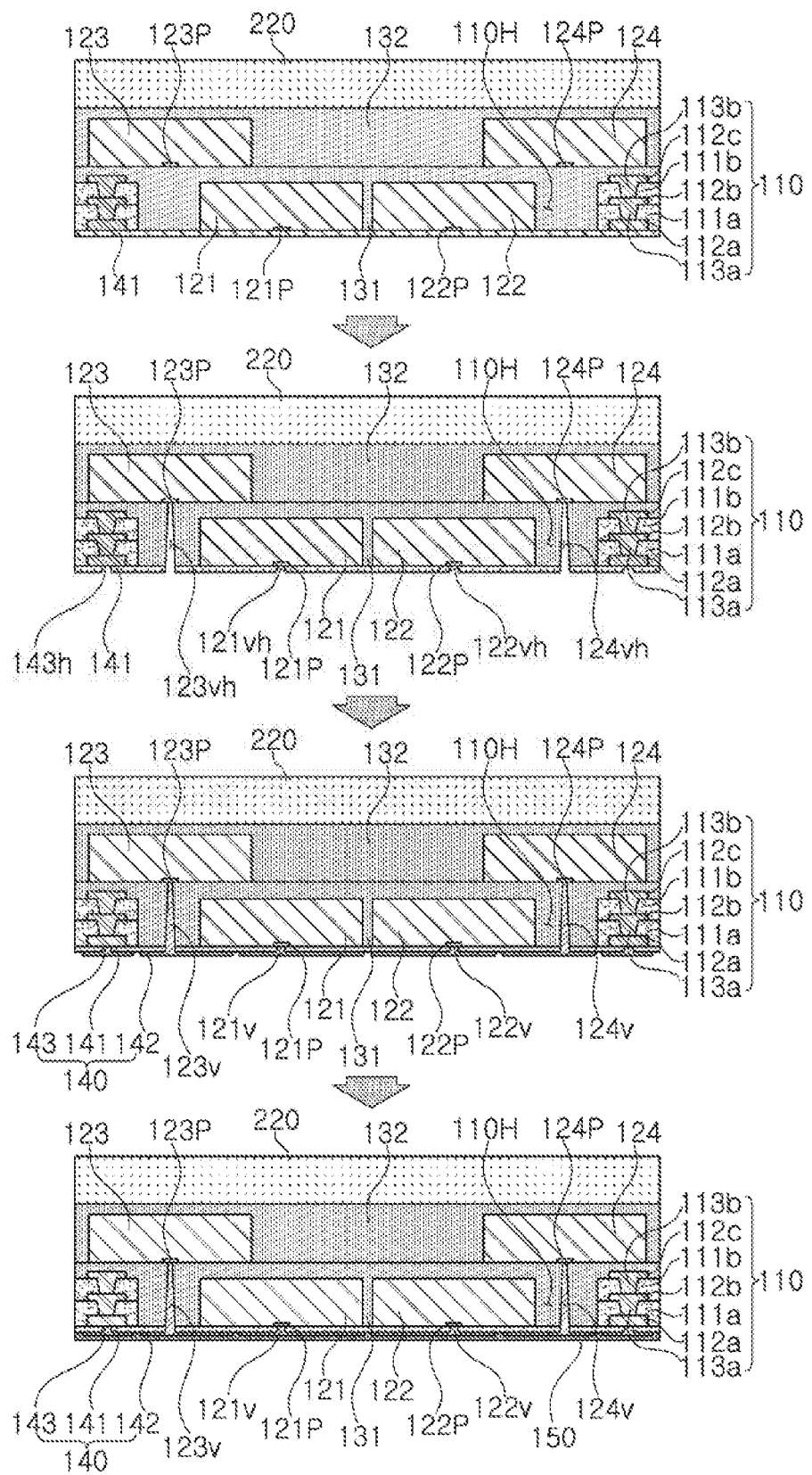

Then, referring to FIG. 11C, the insulating layer 141 may be formed in a region in which the adhesive film 210 is removed. The insulating layer 141 may be formed by a lamination method or an applying method using the insulating material as described above. Then, via holes 143h for the vias 143 and via holes 121vh, 122vh, 123vh, and 124vh for the first to fourth vias 121v, 122v, 123v, and 124v may be formed. These via holes may be independently formed by exposure and development methods, a laser drill, or the like. Then, the redistribution layer 142, the vias 143, and the first to fourth vias 121v, 122v, 123v, and 124v may be formed by plating. The plating process may be a subtractive process, an additive process, a semi-additive process (SAP), a modified semi-additive process (MSAP), or the like, but is not limited thereto. The second connection member 140 may be formed on the first connection member 110 and the active surfaces of the plurality of semiconductor chips 121, 122, 123, and 124 through a series of processes. Then, the passivation layer 150 may be formed on the second connection member 140, if necessary. The passivation layer 150 may also be formed by a method of laminating a precursor of the passivation layer 150 and then hardening the precursor, a method of applying a material for forming the passivation layer 150 and then hardening the material, or the like.

Figure 11D:
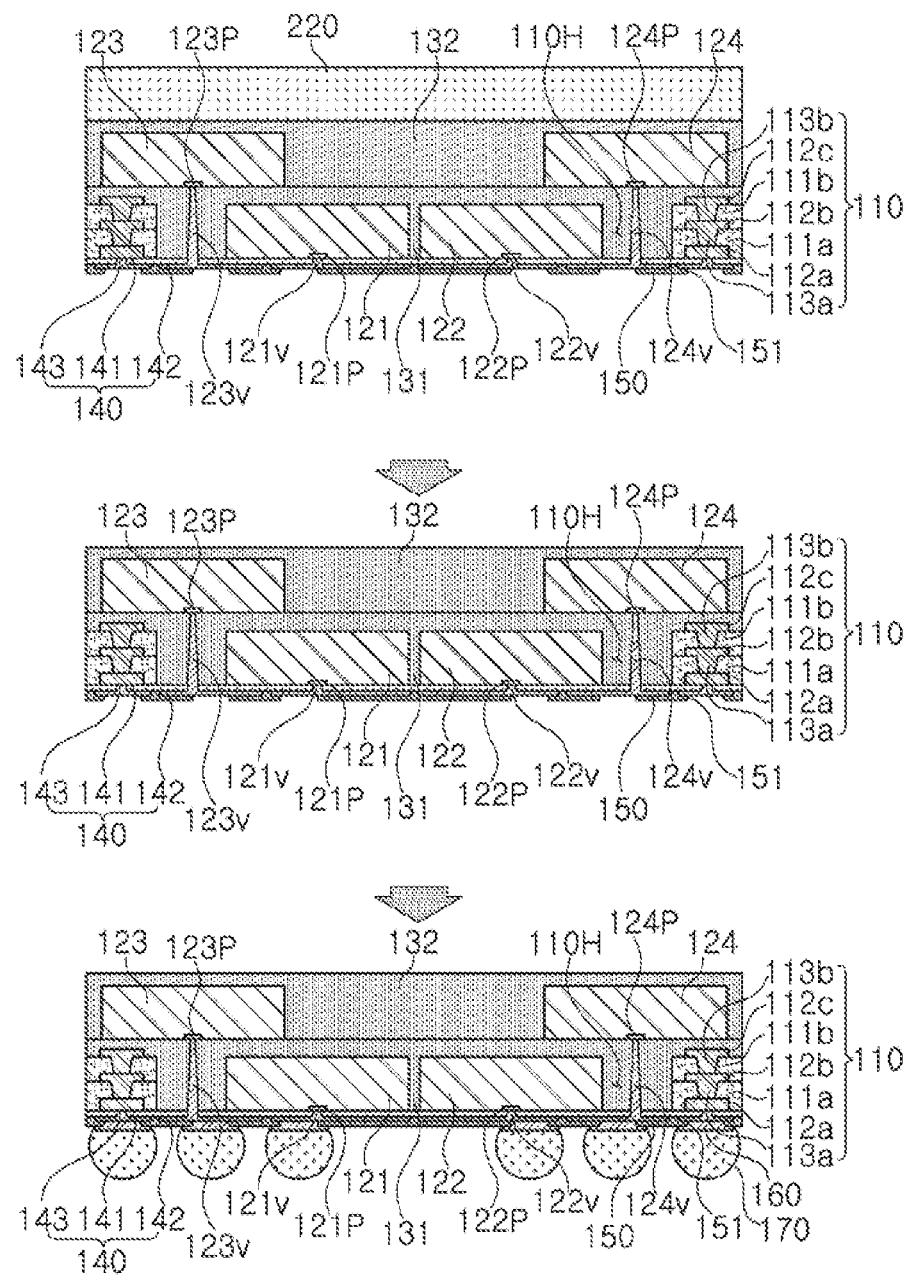

Then, referring to FIG. 11D, the openings 151 may be formed in the passivation layer 150 to expose at least portions of the redistribution layer 142 of the second connection member 140, and the underbump metal layer 160 may be formed in the openings 151 by the known metallization method. Then, the connection terminals 170 may be formed on the underbump metal layers 160. A method of forming the connection terminals 170 is not particularly limited. That is, the connection terminals 170 may be formed by the method well-known in the related art depending on their structures or forms. The connection terminals 170 may be fixed by reflow, and portions of the connection terminals 170 may be embedded in the passivation layer 150 in order to enhance fixing force, and the remaining portions of the connection terminals 170 may be externally exposed, such that reliability may be improved. Meanwhile, the detachable film 220 may be removed in an appropriate process.

Meanwhile, a series of processes may be processes of preparing the carrier film having a large size, manufacturing a plurality of fan-out semiconductor packages, and then singulating the plurality of fan-out semiconductor packages into individual fan-out semiconductor packages through a sawing process in order to facilitate mass production. In this case, productivity may be excellent.

Figure 12:
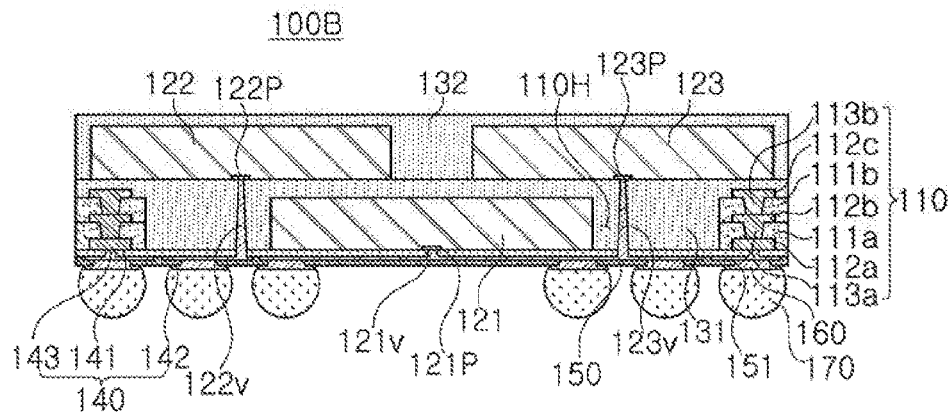
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100B according to another exemplary embodiment in the present disclosure, a first semiconductor chip 121 may be disposed in a through-hole 110H, and second and third semiconductor chips 122 and 123 may be disposed on a first encapsulant 131 to be mismatched to the first semiconductor chip 121. The second and third semiconductor chips 122 and 123 may be disposed side by side. First to third connection pads 121P, 122P, and 123P of the first to third semiconductor chips 121, 122, and 123 may be connected to a redistribution layer 142 of a second connection member 140 through first to third vias 121v, 122v, and 123v having a via conductor form, respectively. The second and third vias 122v and 123v may have heights greater than that of the first via 121v. As described above, the number or a disposition of the semiconductor chips 121, 122, and 123 may be variously changed. A description of configurations and manufacturing methods overlapping those described above will be omitted.

Figure 13:
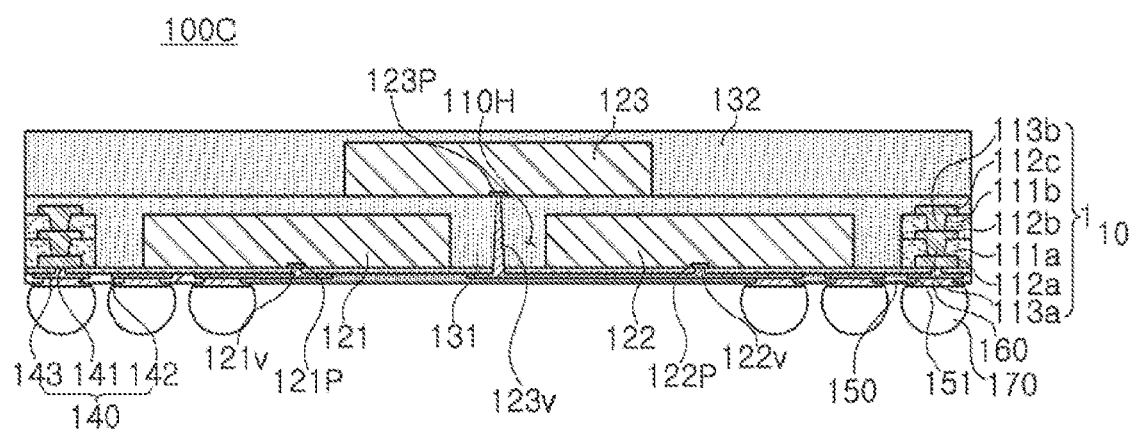
FIG. 13 is a schematic cross-sectional view illustrating another example of a fan-out semiconductor package.

FIG. 13 is a schematic cross-sectional view illustrating another example of a fan-out semiconductor package.

Referring to the drawing, in a fan-out semiconductor package 100C according to another exemplary embodiment in the present disclosure, first and second semiconductor chips 121 and 122 may be disposed in a through-hole 110H, and a third semiconductor chip 123 may be disposed on a first encapsulant 131 to be mismatched to both of the first and second semiconductor chips 121 and 122. First to third connection pads 121P, 122P, and 123P of the first to third semiconductor chips 121, 122, and 123 may be connected to a redistribution layer 142 of a second connection member 140 through first to third vias 121v, 122v, and 123v having a via conductor form, respectively. The third via 123v may have a height greater than those of first and second vias 121v and 122v. The third via 123v may penetrate through the first encapsulant 131 filling a space between the first and second semiconductor chips 121 and 122. As described above, the number or a disposition of the semiconductor chips 121, 122, and 123 may be variously changed. A description of configurations and manufacturing methods overlapping those described above will be omitted.

Figure 14:
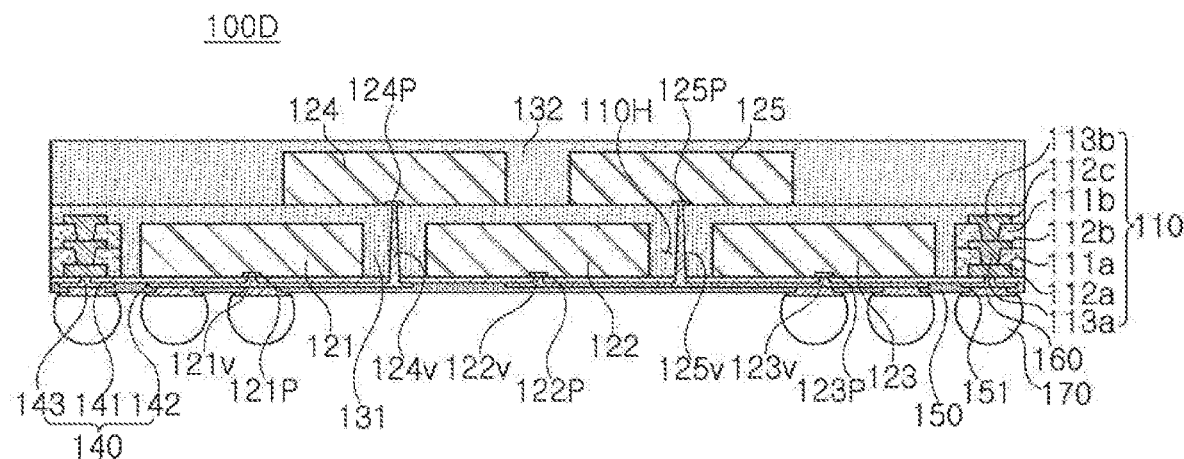
FIG. 14 is a schematic cross-sectional view illustrating another example of a fan-out semiconductor package.

FIG. 14 is a schematic cross-sectional view illustrating another example of a fan-out semiconductor package.

Referring to the drawing, in a fan-out semiconductor package 100D according to another exemplary embodiment in the present disclosure, first to third semiconductor chips 121, 122, and 123 may be disposed in a through-hole 110H, a fourth semiconductor chip 124 may be disposed on a first encapsulant 131 to be mismatched to the first and second semiconductor chips 121 and 122, and a fifth semiconductor chip 125 may be disposed on the first encapsulant 130 to be mismatched to the second and third semiconductor chips 122 and 123. First to fifth connection pads 121P, 122P, 123P, 124P, and 125P of the first to fifth semiconductor chips 121, 122, 123, 124, and 125 may be connected to a redistribution layer 142 of a second connection member 140 through first to fifth vias 121v, 122v, 123v, 124v, and 125v having a via conductor form, respectively. The fourth and fifth vias 124v and 125v may have heights greater than those of the first to third vias 121v, 122v, and 123v. The fourth via 124v may penetrate through the first encapsulant 131 filling a space between the first and second semiconductor chips 121 and 122. The fifth via 125v may penetrate through the first encapsulant 131 filling a space between the second and third semiconductor chips 122 and 123. As described above, the number or a disposition of the semiconductor chips 121, 122, 123, 124, and 125 may be variously changed. A description of configurations and manufacturing methods overlapping those described above will be omitted.

Figure 15:
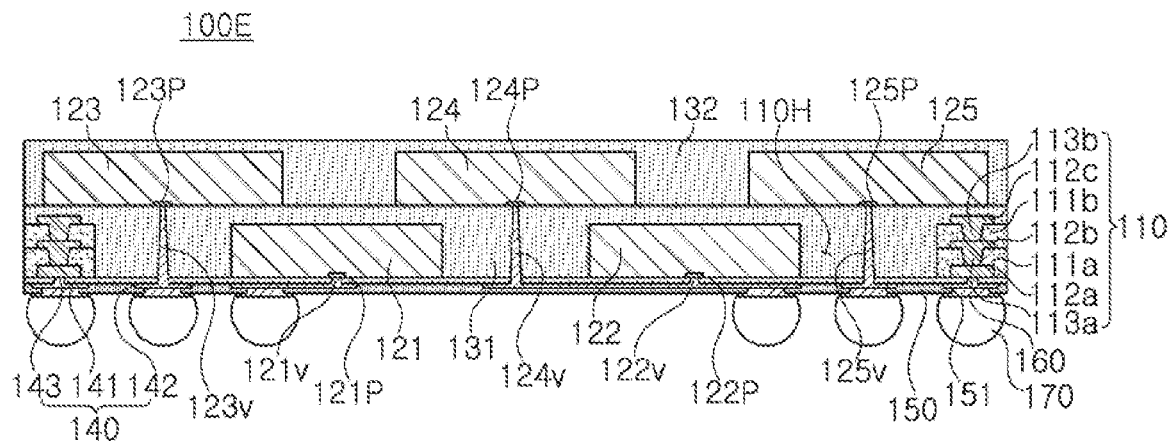
FIG. 15 is a schematic cross-sectional view illustrating another example of a fan-out semiconductor package.

FIG. 15 is a schematic cross-sectional view illustrating another example of a fan-out semiconductor package.

Referring to the drawing, in a fan-out semiconductor package 100E according to another exemplary embodiment in the present disclosure, first and second semiconductor chips 121 and 122 may be disposed in a through-hole 110H, a third semiconductor chip 123 may be disposed on a first encapsulant 131 to be mismatched to the first semiconductor chip 121, a fourth semiconductor chip 124 may be disposed on the first encapsulant 131 to be mismatched to the first and second semiconductor chips 121 and 122, and a fifth semiconductor chip 125 may be disposed on the first encapsulant 130 to be mismatched to the second semiconductor chip 122. First to fifth connection pads 121P, 122P, 123P, 124P, and 125P of the first to fifth semiconductor chips 121, 122, 123, 124, and 125 may be connected to a redistribution layer 142 of a second connection member 140 through first to fifth vias 121v, 122v, 123v, 124v, and 125v having a via conductor form, respectively. The third to fifth vias 123v, 124v, and 125v may have heights greater than those of the first and second vias 121v and 122v. The third via 123v may penetrate through the first encapsulant 131 filling a space between a first connection member 110 and the first semiconductor chip 121. The fourth via 124v may penetrate through the first encapsulant 131 filling a space between the first and second semiconductor chips 121 and 122. The fifth via 125v may penetrate through the first encapsulant 131 filling a space between the second semiconductor chip 122 and the first connection member 110. As described above, the number or a disposition of the semiconductor chips 121, 122, 123, 124, and 125 may be variously changed. A description of configurations and manufacturing methods overlapping those described above will be omitted.

Figure 16:
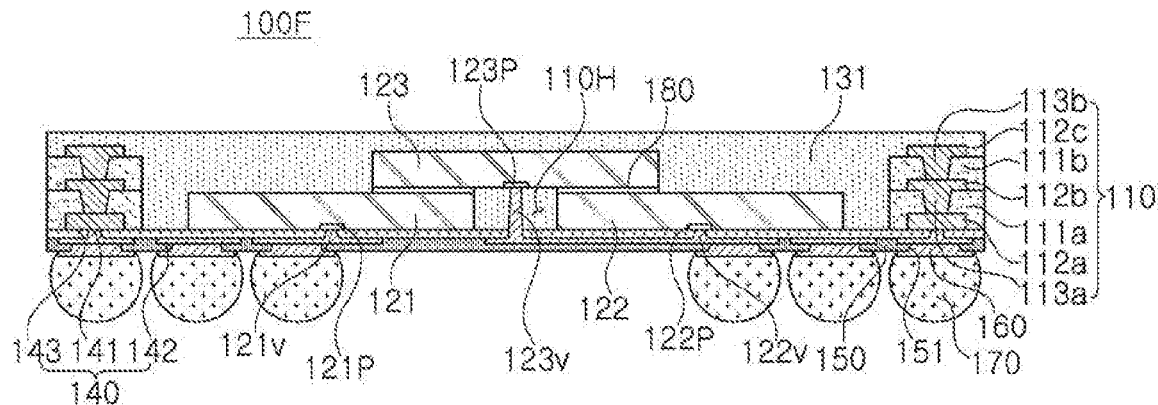
FIG. 16 is a schematic cross-sectional view illustrating another example of a fan-out semiconductor package.

FIG. 16 is a schematic cross-sectional view illustrating another example of a fan-out semiconductor package.

Referring to the drawing, in a fan-out semiconductor package 100F according to another exemplary embodiment in the present disclosure, first and second semiconductor chips 121 and 122 may be disposed in a through-hole 110H, and a third semiconductor chip 123 may be attached to inactive surfaces of the first and second semiconductor chips 121 and 122 in the through-hole 110H. The third semiconductor chip 123 may have an active surface attached to the inactive surfaces of the first and second semiconductor chips 121 and 122, and may be attached to the first and second semiconductor chips 121 and 122 to be mismatched to the first and second semiconductor chips 121 and 122 so that third connection pads 123P thereof may be connected to a redistribution layer 142 of a second connection member 140. The attachment may be performed using an adhesive member 180. Here, the adhesive member 180 is not particularly limited, but may be a material that may attach the third semiconductor chip 123 to the first and second semiconductor chips 121 and 122, such as the known tape, adhesive, or the like. A first encapsulant 131 may encapsulate at least portions of the first to third semiconductor chips 121, 122, and 123. A second encapsulant 132 may be omitted. First to third connection pads 121P, 122P, and 123P of the first to third semiconductor chips 121, 122, and 123 may be connected to a redistribution layer 142 of a second connection member 140 through first to third vias 121v, 122v, and 123v having a via conductor form, respectively. The third via 123v may have a height greater than those of first and second vias 121v and 122v. The third via 123v may penetrate through the first encapsulant 131 filling a space between the first and second semiconductor chips 121 and 122. As described above, the number or a disposition of the semiconductor chips 121, 122, and 123 may be variously changed. A description of configurations and manufacturing methods overlapping those described above will be omitted. Meanwhile, the structural features of the fan-out semiconductor package 100F described above may be appropriately combined with the fan-out semiconductor packages 100A to 100E described above.

Figure 17:
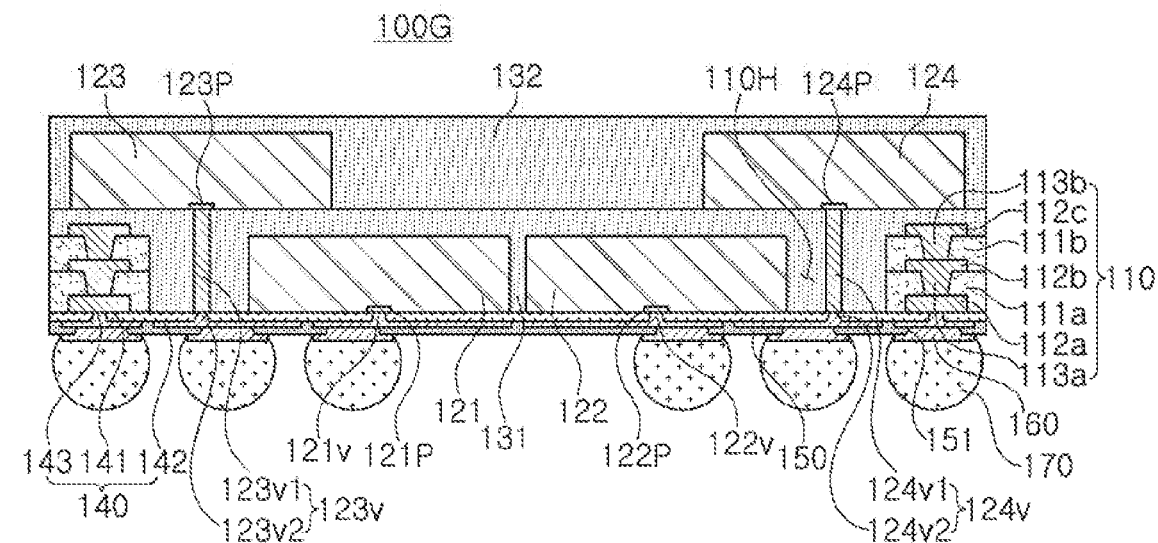
FIG. 17 is a schematic cross-sectional view illustrating another example of a fan-out semiconductor package.

FIG. 17 is a schematic cross-sectional view illustrating another example of a fan-out semiconductor package.

Referring to the drawing, in a fan-out semiconductor package 100G according to another exemplary embodiment in the present disclosure, third and fourth vias 123v and 124v may include metal posts 123v1 and 124v1 each connected to third and fourth connection pads 123P and 124P and via conductors 123v2 and 124v2 connected to a redistribution layer 142 of a second connection member 140, respectively. The metal posts 123v1 and 124v1 may be embedded in a first encapsulant 131, and may have heights greater than thicknesses of first and second semiconductor chips 121 and 122. The via conductors 123v2 and 124v2 may penetrate through an insulating layer 141 of the second connection member 140, and may have heights equal to or smaller than those of first and second vias 121v and 122v. The respective metal posts 123v1 and 124v1 and via conductors 123v2 and 124v2 may be connected to each other. The metal posts 123v1 and 124v1 may be formed before the first encapsulant 131 is formed. The metal posts 123v1 and 124v1 may be, for example, copper posts, but are not limited thereto. A description of configurations and manufacturing methods overlapping those described above will be omitted. Meanwhile, the structural features of the fan-out semiconductor package 100G described above may be appropriately combined with the fan-out semiconductor packages 100A to 100F described above.

Figure 18:
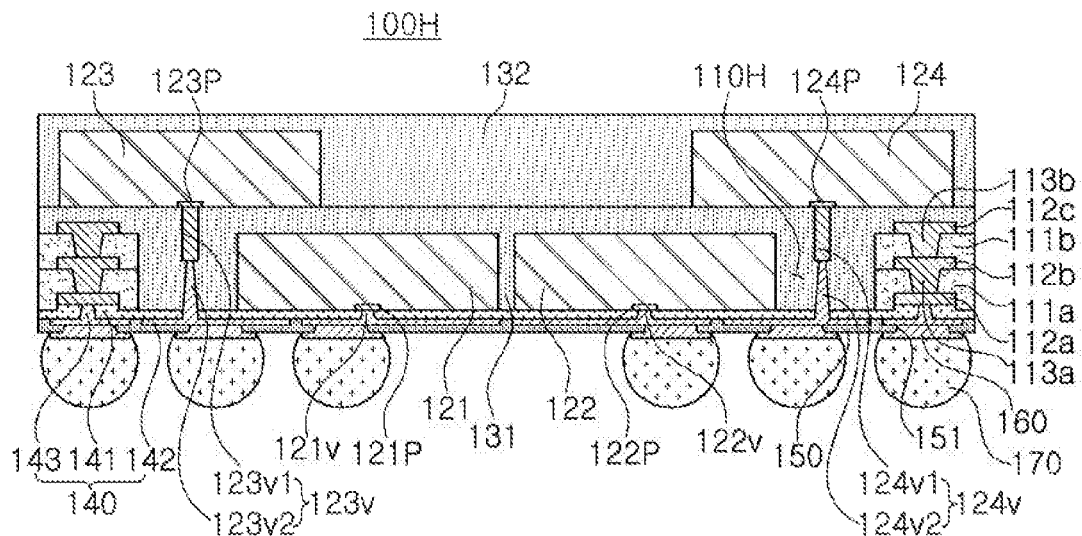
FIG. 18 is a schematic cross-sectional view illustrating another example of a fan-out semiconductor package.

FIG. 18 is a schematic cross-sectional view illustrating another example of a fan-out semiconductor package.

Referring to the drawing, in a fan-out semiconductor package 100H according to another exemplary embodiment in the present disclosure, third and fourth vias 123v and 124v may include metal posts 123v1 and 124v1 each connected to third and fourth connection pads 123P and 124P and via conductors 123v2 and 124v2 connected to a redistribution layer 142 of a second connection member 140, respectively, similar to the fan-out semiconductor package 100G illustrated in FIG. 17. However, the respective metal posts 123v1 and 124v1 may be embedded in a first encapsulant 131, and may have heights smaller than thicknesses of first and second semiconductor chips 121 and 122. Therefore, the via conductors 123v2 and 124v2 in contact with the metal posts 123v1 and 124v1 may penetrate through an insulating layer 141 of the second connection member 140, and may also penetrate through the first encapsulant 131. That is, the via conductors 123v2 and 124v2 may have heights greater than those of first and second vias 121v and 122v. A description of configurations and manufacturing methods overlapping those described above will be omitted. Meanwhile, the structural features of the fan-out semiconductor package 100H described above may be appropriately combined with the fan-out semiconductor packages 100A to 100F described above.

Figure 19:
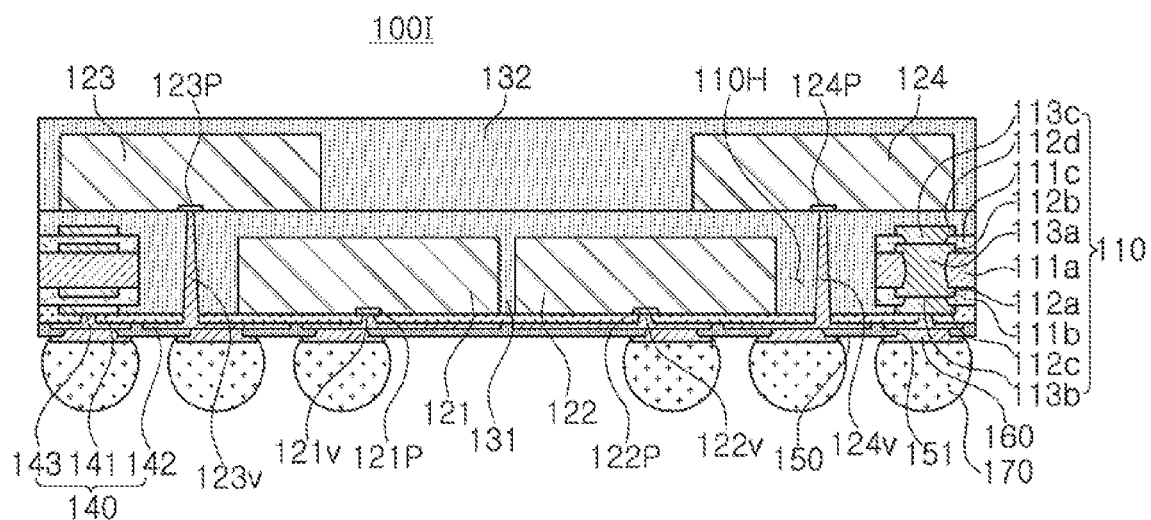
FIG. 19 is a schematic cross-sectional view illustrating another example of a fan-out semiconductor package.

FIG. 19 is a schematic cross-sectional view illustrating another example of a fan-out semiconductor package.

Referring to the drawing, in a fan-out semiconductor package 100I according to another exemplary embodiment in the present disclosure, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c, unlike the fan-out semiconductor package 100A illustrated in FIG. 9. Since the first connection member 110 may include a larger number of redistribution layers 112a, 112b, 112c, and 112d, a second connection member 140 may be further simplified. The first to fourth redistribution layers 112a, 112b, 112c, and 112d may be electrically connected to each other through first to third vias 113a, 113b, and 113c penetrating through the first to third insulating layers 111a, 111b, and 111c, respectively.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first via 113a may have a diameter greater than those of the second via 113b and the third via 113c.

Thicknesses of the redistribution layers 112a, 112b, 112c, and 112d of the first connection member 110 may be greater that that of a redistribution layer 142 of the second connection member 140. Since the first connection member 110 may have a thickness equal to or greater than those of semiconductor chips 121 and 122, the redistribution layers 112a, 112b, 112c, and 112d may also be formed at large sizes. On the other hand, the redistribution layer 142 of the second connection member 140 may be formed at a relatively small size for thinness.

A description of configurations and manufacturing methods overlapping those described above will be omitted. Meanwhile, the features of the fan-out semiconductor packages 100B to 100H described above, that is, stack forms of the semiconductor chips and several forms of multi-stage vias may be introduced into the structure of the fan-out semiconductor package 100I described above.

In the present disclosure, a first element being mismatched to a second element means that the first and second elements partially overlap with each other in a stacking direction along which the first and second elements are stacked on each other, such that the second element disposed on the first element has a portion not overlapping with any portion of the first element in the stacking direction.

As set forth above, according to the exemplary embodiments in the present disclosure, a fan-out semiconductor package capable of being thinned and having improved performance and excellent reliability in spite of using a plurality of semiconductor chips may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a first connection member including a redistribution layer and an insulating layer;
a first semiconductor chip disposed on the insulating layer of the first connection member and having an active surface having a first connection pad disposed thereon and an inactive surface opposing the active surface;
a first encapsulant disposed on the first connection member and encapsulating at least portions of the first semiconductor chip;
a second semiconductor chip disposed on the first encapsulant and having an active surface having a second connection pad disposed thereon and an inactive surface opposing the active surface; and
a second encapsulant disposed on the first encapsulant and encapsulating at least portions of the second semiconductor chip,
wherein the active surfaces of the first semiconductor chip and the second semiconductor chip face the first connection member,
the first encapsulant is disposed in a region between the first and second semiconductor chips and extends from the region between the first and second semiconductor chips to the insulating layer of the first connection member, and portions of the first encapsulant covering at least portions of the inactive surface and side surfaces of the first semiconductor chip and a portion of the first encapsulant covering a portion of the active surface of the second semiconductor chip are made of a same material,
the first connection pad is electrically connected to the redistribution layer of the first connection member through a first via penetrating through the insulating layer of the first connection member, the first via being disposed in the insulating layer of the first connection member and tapered from the redistribution layer to the first connection pad, and
the second connection pad is electrically connected to the redistribution layer of the first connection member through a second via penetrating through the first encapsulant and the insulating layer of the first connection member, the second via being tapered from the redistribution layer to the second connection pad.

2. The semiconductor package of claim 1, wherein the first via and the second via extend in a direction perpendicular to the first connection member.

3. The semiconductor package of claim 1, wherein the first via is spaced apart from the first encapsulant, and
the second via is in contact with the first encapsulant.

4. The semiconductor package of claim 1, wherein the first connection pad is disposed on a central portion of the active surface of the first semiconductor chip, and
the second connection pad is disposed on a central portion of the active surface of the second semiconductor chip.

5. The semiconductor package of claim 1, wherein the first and second semiconductor chips are memory chips that are the same as or different from each other.

6. The semiconductor package of claim 1, further comprising a third semiconductor chip disposed side by side with the first semiconductor chip on the first connection member and having an active surface having a third connection pad disposed thereon and an inactive surface opposing the active surface,
wherein the third connection pad is electrically connected to the redistribution layer of the first connection member through a third via penetrating through the insulating layer of the first connection member.

7. The semiconductor package of claim 1, further comprising a third semiconductor chip disposed side by side with the second semiconductor chip on the first encapsulant and having an active surface having a third connection pad disposed thereon and an inactive surface opposing the active surface,
wherein the third connection pad is electrically connected to the redistribution layer of the first connection member through a third via penetrating through the first encapsulant and the insulating layer of the first connection member.

8. The semiconductor package of claim 1, further comprising:
a third semiconductor chip disposed side by side with the first semiconductor chip on the first connection member and having an active surface having a third connection pad disposed thereon and an inactive surface opposing the active surface; and
a fourth semiconductor chip disposed side by side with the second semiconductor chip on the first encapsulant and having an active surface having a fourth connection pad disposed thereon and an inactive surface opposing the active surface,
wherein the third connection pad is electrically connected to the redistribution layer of the first connection member through a third via penetrating through the insulating layer of the first connection member, and
the fourth connection pad is electrically connected to the redistribution layer of the first connection member through a fourth via penetrating through the first encapsulant and the insulating layer of the first connection member.

9. The semiconductor package of claim 1, further comprising a second connection member having a through-hole,
wherein the first semiconductor chip is disposed in the through-hole of the second connection member, and
the first encapsulant encapsulates at least portions of the second connection member.

10. The semiconductor package of claim 9, wherein the second connection member includes a first insulating layer, a first redistribution layer in contact with the first connection member and embedded in the first insulating layer, and a second redistribution layer disposed on the other surface of the first insulating layer opposing one surface of the first insulating layer in which the first redistribution layer is embedded, and
the first and second redistribution layers are electrically connected to the first and second connection pads at least through the redistribution layer of the first connection member.

11. The semiconductor package of claim 10, wherein the second connection member further includes a second insulating layer disposed on the first insulating layer and covering the second redistribution layer and a third redistribution layer disposed on the second insulating layer, and
the third redistribution layer is electrically connected to the first and second connection pads at least through the redistribution layer of the first connection member.

12. The semiconductor package of claim 9, wherein the second connection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer, and
the first to third redistribution layers are electrically connected to the first and second connection pads at least through the redistribution layer of the first connection member.

13. The semiconductor package of claim 12, wherein the second connection member further includes a third insulating layer disposed on the first insulating layer and covering the second redistribution layer and a fourth redistribution layer disposed on the third insulating layer, and
the fourth redistribution layer is electrically connected to the first and second connection pads at least at least through the redistribution layer of the first connection member.

14. The semiconductor package of claim 1, wherein the redistribution layer of the first connection member physically contacts with the second via.

15. The semiconductor package of claim 1, wherein the second via includes a seed layer in contact with a wall of a via hole in which the second via is disposed.

16. The semiconductor package of claim 1, wherein a side wall of the second via passes and is inclined with an interface of the insulating layer of the first redistribution member and the first encapsulant.

17. A semiconductor package comprising:
a first connection member including a redistribution layer and an insulating layer;
a first semiconductor chip disposed on the insulating layer of the first connection member and having an active surface having a first connection pad disposed thereon and an inactive surface opposing the active surface;
a first encapsulant disposed on the first connection member and encapsulating at least portions of the first semiconductor chip;
a second semiconductor chip disposed on the first encapsulant and having an active surface having a second connection pad disposed thereon and an inactive surface opposing the active surface; and
a second encapsulant disposed on the first encapsulant and encapsulating at least portions of the second semiconductor chip,
wherein the active surfaces of the first semiconductor chip and the second semiconductor chip face the first connection member,
the first connection pad is electrically connected to the redistribution layer of the first connection member through a first via penetrating through the insulating layer of the first connection member, the first via being disposed in the insulating layer of the first connection member and tapered from the redistribution layer to the first connection pad, the second connection pad is electrically connected to the redistribution layer of the first connection member through a second via penetrating through the first encapsulant and the insulating layer of the first connection member, the second via includes a metal post in contact with the second connection pad and a via conductor in contact with the redistribution layer of the first connection member, the metal post and the via conductor are connected to each other, the via conductor penetrates through the insulating layer of the first connection member into the first encapsulant, an interface between the metal post and the via conductor is embedded in the first encapsulant and spaced apart from the insulating layer of the first connection member, and the via conductor is tapered from the redistribution layer to the interface between the metal post and the via conductor.

18. The semiconductor package of claim 17, wherein on a level of the interface between the metal post and the via conductor, a size of the metal post is different from that of the via conductor.

19. A semiconductor package comprising:
a first connection member having a through-hole;
a first semiconductor chip disposed in the through-hole and having an active surface having first connection pads disposed thereon and an inactive surface opposing the active surface;
a second semiconductor chip mounted on the inactive surface of the first semiconductor chip through an adhesive member and having an active surface having second connection pads disposed thereon and an inactive surface opposing the active surface;
an encapsulant encapsulating at least portions of the first connection member, the first semiconductor chip, and the second semiconductor chip; and
a second connection member disposed on the first connection member and the active surface of the first semiconductor chip, and including an insulating layer and a redistribution layer electrically connected to the first connection pads and the second connection pads,
wherein the first connection pads and the second connection pads are electrically connected to the redistribution layer of the second connection member through first vias and second vias, respectively,
each of the first vias penetrates through the insulating layer of the second connection member and is tapered from the redistribution layer to a respective one of the first connection pads, and
each of the second vias penetrates through the encapsulant and the insulating layer of the second connection member, and is tapered from the redistribution layer to a respective one of the second connection pads.

* * * * *